(12) United States Patent
Dicke et al.

(10) Patent No.: US 10,164,633 B2
(45) Date of Patent: Dec. 25, 2018

(54) ON-CHIP IMPEDANCE NETWORK WITH DIGITAL COARSE AND ANALOG FINE TUNING

(71) Applicant: Invensas Corporation, San Jose, CA (US)

(72) Inventors: Curtis Dicke, Colorado Springs, CO (US); George Courville, Colorado Springs, CO (US); David Edward Fisch, Pleasanton, CA (US); Randall Sandusky, Woodland Park, CO (US); Kent Stalnaker, Colorado Springs, CO (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 15/645,125

(22) Filed: Jul. 10, 2017

(65) Prior Publication Data

US 2017/0310322 A1 Oct. 26, 2017

Related U.S. Application Data

(63) Continuation of application No. 14/829,511, filed on Aug. 18, 2015, now Pat. No. 9,705,497, which is a continuation of application No. 13/901,520, filed on May 23, 2013, now Pat. No. 9,111,671.

(60) Provisional application No. 61/650,949, filed on May 23, 2012.

(51) Int. Cl.
*H03L 5/00* (2006.01)
*H03K 19/00* (2006.01)
*H01C 10/50* (2006.01)
*G11C 7/10* (2006.01)
*H03F 3/45* (2006.01)

(52) U.S. Cl.
CPC ....... *H03K 19/0005* (2013.01); *G11C 7/1057* (2013.01); *H01C 10/50* (2013.01); *H03F 3/45475* (2013.01)

(58) Field of Classification Search
CPC ............. H04L 25/0278; H04L 25/0298; H04L 25/028; H03K 19/0005; G06F 13/4086
USPC ............................................. 327/308; 326/30
See application file for complete search history.

(56) References Cited

U.S. PATENT DOCUMENTS

| | | | |
|---|---|---|---|
| 5,680,060 A * | 10/1997 | Banniza | H03H 11/28 326/30 |
| 6,924,660 B2 | 8/2005 | Nguyen et al. | |
| 7,196,567 B2 | 3/2007 | Nguyen | |
| 7,521,957 B2 | 4/2009 | Koo | |
| 7,692,446 B2 | 4/2010 | Lee et al. | |

(Continued)

*Primary Examiner* — Quan Tra

(57) ABSTRACT

System and method for providing precision a self calibrating resistance circuit is described that provides for matching a reference resistor using dynamically configurable resistance networks. The resistor network is coupled to the connection, wherein the resistor network provides a configurable resistance across the connection. In addition, the resistor network comprises a digital resistor network and an analog resistor network. Also, the circuit includes control circuitry for configuring the configurable resistance based on a reference resistance of the reference resistor. The configurable resistance is configured by coarsely tuning the resistor network through the digital resistor network and fine tuning the resistor network through the analog resistor network.

5 Claims, 16 Drawing Sheets

(56) References Cited

U.S. PATENT DOCUMENTS

2006/0279345 A1\* 12/2006 Koo .................... H04L 25/0278
327/308

\* cited by examiner

| RS1 | RS2 | RANGE (Ohms) | NOTES |
|---|---|---|---|
| 0 | 0 | 240-180 | MAX |
| 0 | 1 | 180-135 | NOM |
| 1 | 0 | 135-100 | MIN |

ON-CHIP IMPEDANCE NETWORK WITH DIGITAL COARSE AND ANALOG FINE TUNING

CROSS REFERENCE TO RELATED APPLICATIONS

The present application is a continuation of U.S. patent application Ser. No. 14/829,511, filed Aug. 18, 2015, which is a continuation of U.S. patent application Ser. No. 13/902,520, filed May 23, 2013, now U.S. Pat. No. 9,111,671, which claims priority to and the benefit of U.S. Provisional Application No. 61/650,949, filed May 23, 2012, which are herein incorporated by reference in their entirety.

BACKGROUND

Conventional dynamic random access memory (DRAM) memory module architectures typically include line termination resistors on the motherboard. Although the termination resistors on the motherboard reduce some reflections on the signal lines, they are unable to prevent reflections resulting from the stub lines that connect to the DRAM on the module. That is, termination resistors mounted on a motherboard do not prevent transmission line effects from the transmission line stubs between the resistors and the receiving device. For instance, a signal propagating from the memory controller to the DRAM encounters an impedance discontinuity at the stub leading to the DRAM on the module. The signal that propagates along the stub to the DRAM is reflected back onto the signal line, thereby introducing unwanted noise into the signal.

The introduced noise and the consequential signal degradations that are not addressed by such off-die termination become more pronounced with higher data rates and longer stub lengths. Larger, multi-drop systems containing multiple DRAM modules introduce even more reflections and consequently add more reflective noise, thereby resulting in further signal degradation.

One solution is to provide on-die termination for transmission lines, instead of line termination on the motherboard. By placing the termination resistance on the die itself rather than on the motherboard, the reflections resulting from discontinuities in the line are significantly reduced. This produces a cleaner signal and enables faster data rates.

However, problems may be presented when the transmission lines are terminated using on-die resistors. Process variations for manufacturing semiconductor devices may result in fluctuating resistance values. When implemented as an on-die termination resistance, this results in improper termination valuation. Also, temperature and voltage fluctuations presented on the die will affect the resistance values of the semiconductors used for building resistors used for termination on the die. This results in a variation of the on-die termination resistance, which increases the noise and reflections on the transmission line negatively affecting the signal transferred along the transmission line.

What is needed is an on-die termination resistance circuit that accounts for process variations in the manufacture of semiconductor devices, as well as temperature and voltage fluctuations affecting devices used for termination resistance on a die.

SUMMARY

Embodiments of the present invention generally relate to integrated circuits, and more specifically to self calibration circuits and method for implementing the same for tuning a configurable resistor network to a reference resistor. In one embodiment, the self calibration circuit is used to match a reference resistance provided by a connection to a configurable resistor network that comprises a digital portion for coarse tuning the configurable resistor network and an analog portion for dynamic fine tuning of the configurable resistor network. In other embodiments, systems and methods are described for providing precision on-die termination of a connection that provides a signal from a reference resistor.

A self calibrating resistance circuit is described that provides for tuning a configurable resistance to a reference resistance. In one implementation, the self calibrating resistance circuit is used to terminate a connection providing the reference resistance using dynamically configurable on-die resistance networks. The resistor network is coupled to the connection, wherein the resistor network provides a configurable resistance across the connection. In addition, the resistor network comprises a digital resistor network and an analog resistor network. Also, the circuit includes control circuitry for configuring the configurable resistance based on a reference resistance of the reference resistor. The configurable resistance is configured by coarsely tuning the resistor network through the digital resistor network and dynamically fine tuning the resistor network through the analog resistor network.

In another embodiment, a self calibrating resistance circuit is described that provides for tuning a configurable resistance to a reference resistance including a range selector for setting an initial resistance of the configurable resistance. A connection provides a signal from a reference resistor comprising a reference resistance. The circuit includes a resistor network coupled to the connection, wherein the resistor network provides a configurable resistance across the connection and comprises a digital resistor network and an analog resistor network. The digital resistor network provides for configuring a digital portion of the configurable resistance, and the analog resistor network provides for configuring an analog portion of the configurable resistance across the connection. The digital portion and the analog portion are coupled in parallel. Also, the circuit includes control circuitry for configuring the configurable resistance based on a reference resistance of the reference resistor. The configurable resistance is configured by coarsely tuning the resistor network through the digital resistor network and dynamically fine tuning the resistor network through the analog resistor network. The circuit also includes a range selector for configuring a range used for setting an initial resistance of the digital portion of the configurable resistance.

In another embodiment, a method for self calibrating a resistance is described that provides for tuning a configurable resistance to a reference resistance provided by a signal across a connection. The method includes turning a resistor network that provides a configurable resistance across the connection, and comprises a digital resistor network and an analog resistor network coupled in parallel. The method includes coarsely tuning the digital resistor network to configure the digital portion of the resistor network. In addition, fine tuning of the analog resistor network is performed to configure the analog portion of the configurable resistance. The configurable resistance is related to or based on the reference resistance provided by the connection.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 8 is a table illustrating a range select feature of the self calibrating resistance circuit, in accordance with one embodiment of the disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Accordingly, embodiments of the present disclosure provide a circuit and method for self calibrating to a reference resistor. Embodiments of the present invention are disclosed within the context of integrated circuits and self calibrating resistance circuitry that is implementable for various functions, such as the tuning to a reference resistance provided by a connection or transmission lines to the integrated circuit. For instance, the integrated circuit may include a memory array structure (e.g., DRAM memory array), wherein the self calibrating resistance circuit and method for implementing the same is used to terminate a transmission line to the memory array.

Figure 1:
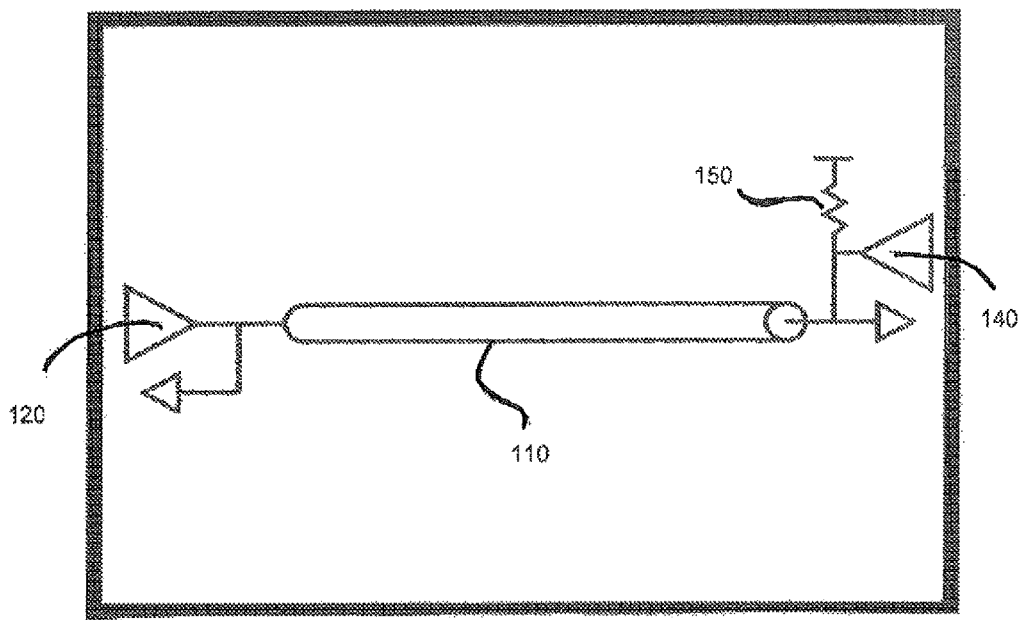
FIG. 1 is a diagram illustrating on-die termination of a transmission line, in accordance with one embodiment of the disclosure.

FIG. 1 is a diagram 100 illustrating on-die termination of a transmission line, in accordance with one embodiment of the invention. By placing the termination resistance on the die itself, rather than on the motherboard, the reflections resulting from discontinuities in the transmission line are significantly reduced. This produces a cleaner signal and enables faster data rates.

As shown in FIG. 1, a signal propagates from a driver 120 (e.g., memory controller) to a device 140, such as a memory array structure (e.g., DRAM memory array). Instead of a having an off-die termination resistance that introduces a second stub and its related impedance discontinuities, a single stub 110 is introduced between the memory controller 120 and the device 140. Stub 110 represents the transmission line between the driver 120 and the device 140. As such, a termination resistance 150 is able to match the resistance presented over the transmission line as represented by the single stub 110.

In embodiments of the present invention, on-die termination is implemented with several combinations of resistors to form resistance 150 on the die. For instance, on-die termination is implemented with a configurable resistor array including a digital portion providing coarse tuning of the configurable resistor and an analog portion providing fine tuning of the configurable resistor. The final resistance of the configurable resistor is determined by an external reference resistor, such as that represented by sub 110. As such, the configurable resistor is configured to create a proper equivalent impedance value to the outside of the die.

Figure 2:
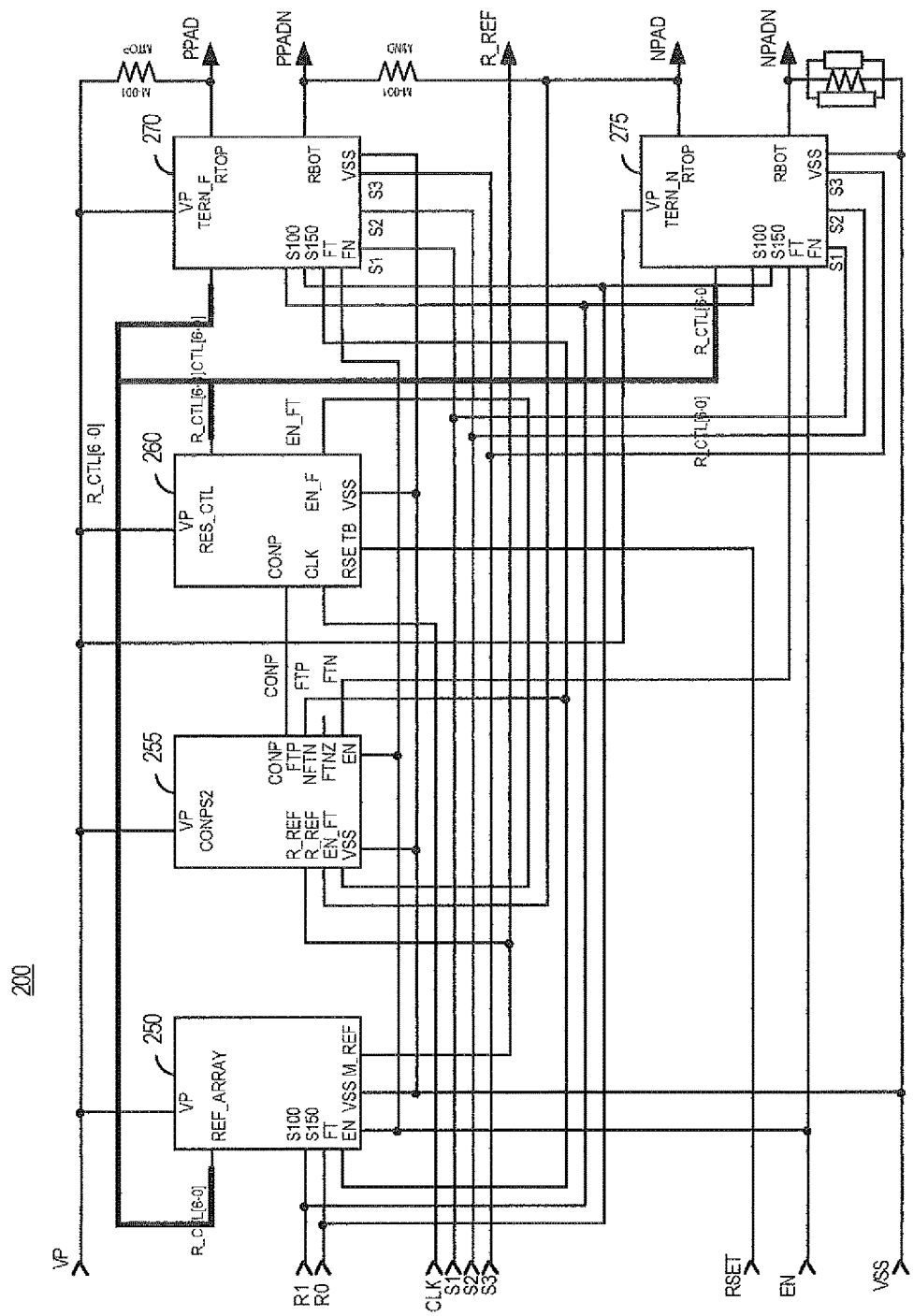
FIG. 2 is a schematic illustrating a self calibration resistance circuit including a TERM_P resistance network for terminating a line to a power supply, such as $V_{DD}$, and an TERM_N resistance network for terminating a line to ground or Vss, in accordance with one embodiment of the disclosure.

FIG. 2 is a schematic illustrating a self calibration resistance circuit 200 for self calibrating a configurable resistor to a reference resistor provided over a connection, in accordance with one embodiment of the invention. In one implementation, the configurable resistor is used for on-die line termination. That is, the resistance circuit 200 is included within an integrated circuit that is coupled to the connection. In that case, the configurable resistor comprises an internal termination resistance, and the reference resistor comprises an external reference resistor, such as that provided over the connection.

Circuit 200 includes a resistor network that is coupled to a connection (not shown), wherein the connection provides a signal from reference resistor. The resistor network provides a configurable resistance across the connection, wherein the resistor network comprises a digital resistor network 250 and an analog resistor network, wherein the analog resistor network is configurable through the TERM_P resistance network 270 and/or the TERM_N resistance network 275. The digital resistor network 250 is used to coarsely tune the resistor network through a digital portion, whereas the analog resistor network is used to finely tune the resistor network through an analog portion.

As shown in FIG. 2, the reference array 250 provides a network of digital resistive switches arranged in a parallel configuration that is used to configure the digital portion of the configurable resistance. The digital resistor network is configured to coarsely tune the configurable resistance.

In one implementation, the self calibration resistance circuit 200B includes an analog resistor network that is configured to fine tune the configurable resistance. More particularly, for analog fine tuning, the self calibration resistance circuit 200 includes a TERM_P resistance network 270 that is used for configuring a resistance referenced to a power supply, such as $V_{DD}$, (e.g., the resistance may be used for terminating a line), and a separate and independent TERM_N resistance network 275 for configuring a resistance referenced to ground or Vss (e.g., the resistance may be used for terminating a line), in accordance with embodiments of the invention.

As such, the TERM-P resistance provides for an analog fine tuning of the configurable resistance for resistances referenced to $V_{DD}$. That is, the TERM_P resistance network 270 provides for an analog portion that is dynamically tuned and configured in parallel with the digital portion of the configurable resistance. Also, the TERM_N resistance network 275 provides for analog fine tuning of the configurable resistance for resistances referenced to ground or Vss. That is, the TERM_N resistance network 275 provides for an analog portion that is dynamically tuned and coupled in parallel with the digital portion of the configurable resistance.

In one embodiment, the TERM_N resistance network 275 is configured using the reference signals generated from the TERM-P resistance network 270. That is, the TERM_P resistance network 270, or its copy, acts as the reference resistance that is used to configure the TERM_N resistance network 275. In one embodiment, the TERM_N resistance network 275 is mirrored to the p-term resistance network 230. That is, a current mirror bias mirrors the bias from the analog FTP signal generated from the TERM_P resistance circuit 270 to form a mirrored FTN signal. The TERM_N resistance network 275 provides for an analog fine tuning of the configurable resistance for resistances referenced to or terminating to ground or Vss.

The self calibrating resistance circuit 200 also includes control circuitry for dynamically configuring a configurable resistor that comprises the digital portion 250 and the analog portion 270 and/or 275. For instance, control circuitry includes the comparator 255 and the resistance control block 260 acting together. The configuration of the configurable resistor is based on a reference resistance of the reference resistor and is accomplished by fine tuning the resistor network through the digital resistor network and fine tuning the resistor network through the analog resistor network.

More particularly, the self calibrating resistance circuit 200 is capable of establishing a configurable resistance or impedance that is proportional to a reference resistor. In one implementation, the resistance circuit 200 is capable of establishing a configurable impedance that is proportional to an external precision resistor. In one embodiment, the proportion is such that the configurable resistance or impedance is substantially identical to the resistance of the reference resistor. In one embodiment, the reference resistance is 240 ohms, which is characteristic of a termination resistance of a DRAM memory structure.

The configurable resistance is configured through combinations of switchable resistors whose final value is tuned to the reference resistor. The configurable resistor comprises a digital portion and an analog portion configured in parallel, wherein the digital portion coarsely tunes the configurable resistance, and the analog portion finely tunes the configurable resistance. That is, the self-calibrating circuit 200 is capable of establishing a configurable resistance that is proportional to a reference resistor, such as an external precision resistor. For instance, in a DRAM memory array structure, on-die termination is implemented to configure the combinations of switchable resistors on the DRAM die, whose final value is determined by an external reference resistor. In addition, the reference resistor is also used for output driver calibration, in another embodiment.

The self calibrating resistance circuit 200 acts in a digital mode and an analog mode. In the digital mode, the circuit 200 forces the TERM_P and TERM_N resistance circuits into an open circuit state. That is, the analog portion of the configurable resistance is not configured. For instance, when EN is inactive, the circuit forces the TERM Rs (TERM_P/TERM_N) into an open circuit state. TERM_P resistance circuit 270 has one terminal connected to positive supply ($V_{DD}$) while TERM_N resistance circuit 275 has one terminal connected to Vss. With EN active and RSETB removed the clock starts, and after a max of 10 system clocks, the TERM Rs values are set, in one embodiment. As such, in the digital mode, the digital portion of the configurable resistance is established through the reference array 250, wherein the reference array 250 comprises a plurality of resistive branches coupled in parallel.

This is accomplished by comparing the divider voltage ratio of REF_ARRAY value/R_REF voltage to an internal divider voltage using the comparator 255. A shift register shifts left or right depending on the output of the comparator 255, and is used to enable or disable a resistive branch of the reference array 250. For instance, shifting in a one enables another parallel resistor bank (all of which are in parallel with the initial range select value) while shifting in a zero disables a resistor bank.

In one embodiment, the self calibrating resistance circuit 200 provides for on-die termination to an integrated circuit (e.g., a DRAM memory array structure). As such, the on-die termination (ODT) calibration is a technique that involves calibrating the termination impedance in order to optimize the reduction of signal reflections. In various embodiments of the present disclosure, ODT calibration allows establishing an optimal termination value that compensates for variations in process and operating conditions. More particularly, the integrated circuit comprises the resistor network and the control circuitry, and wherein the integrated circuit is coupled to the connection. The configurable resistance comprises an internal termination resistance. For instance, the termination resistance is matched to an external reference resistance presented over a transmission line or connection.

Figure 3A:
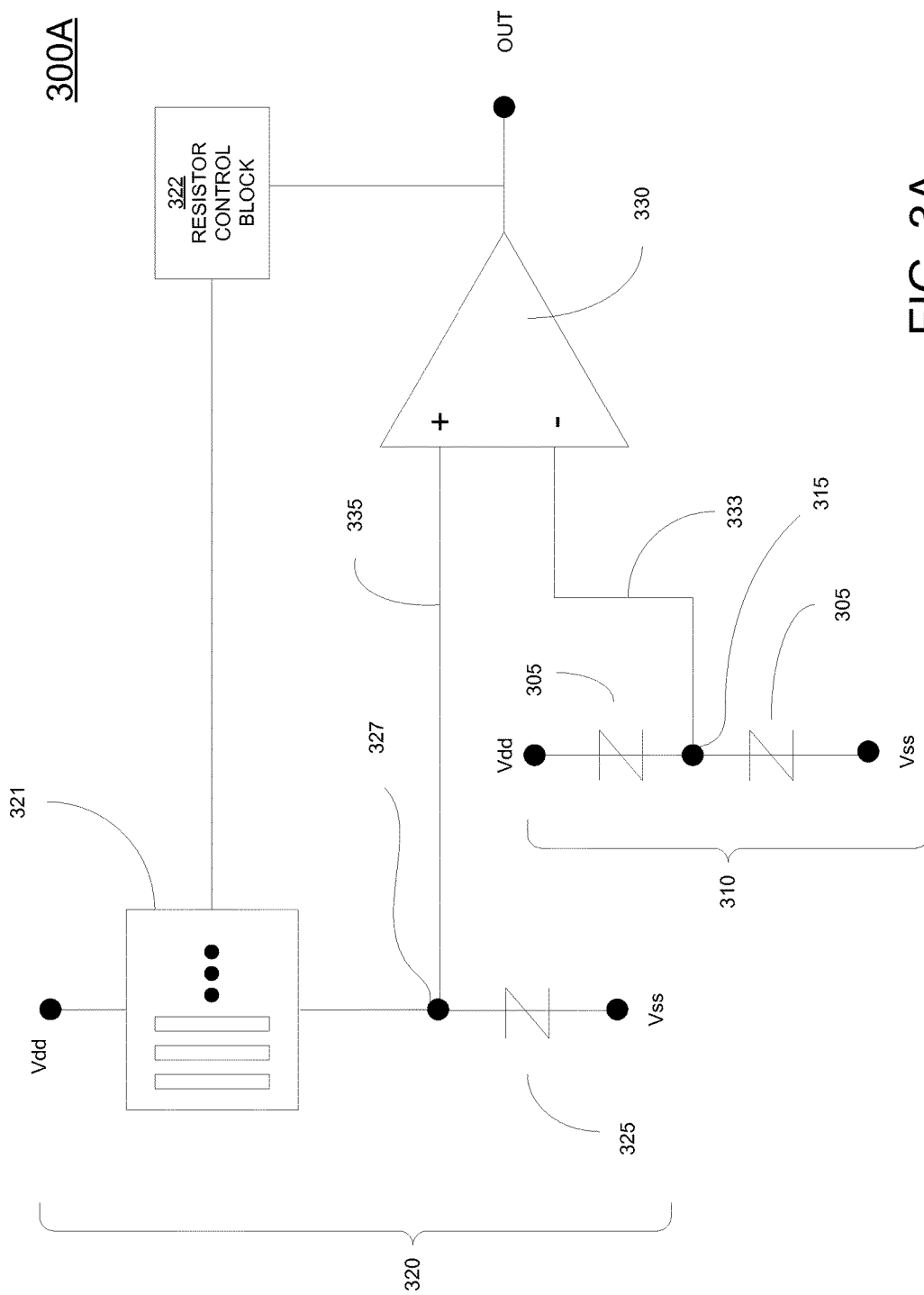
FIG. 3A is a circuit diagram of a comparator in a TERM_P resistance circuit used in a self calibrating resistance circuit for coarsely and digitally converging a digital portion of a resistor network, in accordance with one embodiment of the disclosure.

FIG. 3A is a circuit diagram of a comparator circuit 300A used for configuring a digital portion of a configurable resistor that is referenced to a positive power supply (e.g., $V_{DD}$), in accordance with one embodiment of the invention. That is, comparator circuit 300A is used in a self calibrating resistance circuit for coarsely and digitally converging a digital portion of a resistor network. In one implementation comparator circuit 300A is used within the comparator 255 of FIG. 2. In another implementation, comparator circuit 300A is used within comparator circuit 600 of FIG. 6.

Specifically, the output of the comparator circuit 300A is used to configure the digital portion of the configurable resistor. This is accomplished by comparing divider voltages between a fixed divider voltage and a second divider voltage. The comparator circuit 300A is implementable within the comparator 255 of FIG. 2, in one embodiment. In particular, a fixed voltage divider 310 comprises a fixed divider voltage measurable at node 315. The fixed voltage divider comprises a first resistive component and a second resistive component. In one implementation, the fixed voltage divider includes resistors 305 with a node 315 that is used as an input 353 to the comparator 330. In one embodiment, the resistors in the fixed voltage divider 310 comprises a one-to-one ratio, wherein the resistors 305 are substantially identical. In another embodiment, the resistors in the fixed voltage divider 310 comprises a fixed ratio that is not one-to one, wherein the resistors are not identical.

Another input 335 to the comparator 330 is coupled to a second voltage divider 320 that comprises a second divider voltage measured at node 327. The second voltage divider 320 includes a reference resistor 325, such as an external precision reference resistor. In addition, the second voltage divider 320 includes a configurable resistor that includes a digital portion 321 that is configured through comparator circuit 300A. For purposes of coarse tuning, the digital portion is used, wherein the digital portion comprises a plurality of selectable resistive branches arranged in a parallel configuration. Adding a resistive branch reduces the resistance of the digital portion 321, whereas removing a resistive branch increases the resistance of the digital portion 321.

The comparator 330 is configured to compare the second divider voltage and the fixed divider voltage to generate an output signal from comparator 330. More particularly, the output signal is delivered to the resistor control block 322 in the digital mode to configure the digital portion of the configurable resistance. In one embodiment, resistor control block 322 performs the same functions as resistor control block 260 of FIG. 2. For example, in the comparator circuit 600 of FIG. 6, the COMP signal is provided as an output of the comparator 610, acting in the digital mode, that is delivered to the resistor control block 322. The COMP signal is used to configure the digital portion of the configurable resistance.

In one embodiment, the resistor control block 322 includes digital convergence circuitry for adding or removing one of the plurality of parallel resistive branches used for configuring the digital portion of the configurable resistor as determined by the output signal. In another embodiment, the resistor control block 322 includes a register for adding or removing one of the plurality of parallel resistive branches used for configuring the digital portion of the configurable resistor as determined by the output signal. In still another embodiment, the register comprises a shift register for adding or removing one of the plurality of parallel resistive branches used for configuring the digital portion of the configurable resistor as determined by the output signal.

In particular, the digital convergence circuitry adds a resistive branch when and as long as the output signal indicates said second divider voltage measured at node 327 is lower than the fixed divider voltage measured at node 315. On the other hand, the digital convergence circuitry removes a digital resistive branch when the output signal indicates the second divider voltage measured at node 327 is higher than the reference divider voltage measured at node 315. By starting at a resistance value that is higher than the reference resistor, the self calibrating resistance circuit is able to reduce the digital portion of the configurable resistance through the addition of parallel digital resistive branches.

At a point when the output signal first indicates that the second divider voltage measured at node 327 is higher than the reference divider voltage measured at node 315, the resistor control block 322 removes a digital leg from the digital portion and then locks the digital portion of the configurable resistor. At that time, the voltage measured at node 327 is again lower than the voltage at node 315, thereby indicating that the digital portion of the configurable resistance is again higher than the reference resistance. That is, the digital convergence circuitry digitally converges after a last resistive branch is added, which results in the output signal from the comparator 330 indicating that the second divider voltage at node 327 is higher than the fixed divider voltage at node 315, and when the last resistive branch is thereafter removed so that the configurable resistance is again greater than the reference resistance, which results in the output signal from the comparator 330 indicating that the voltage at node 327 is again lower than the voltage at node 315.

In one embodiment, the digital convergence circuitry digitally converges based on a clock signal. That is, legs are added or removed according to a clock signal. In one embodiment, the clock signal comprises an external clock signal. In another embodiment, the self calibration resistance circuit internally generates the clock signal. For instance, a ring oscillator may be used for generating the clock signal, in one embodiment.

Figure 7:
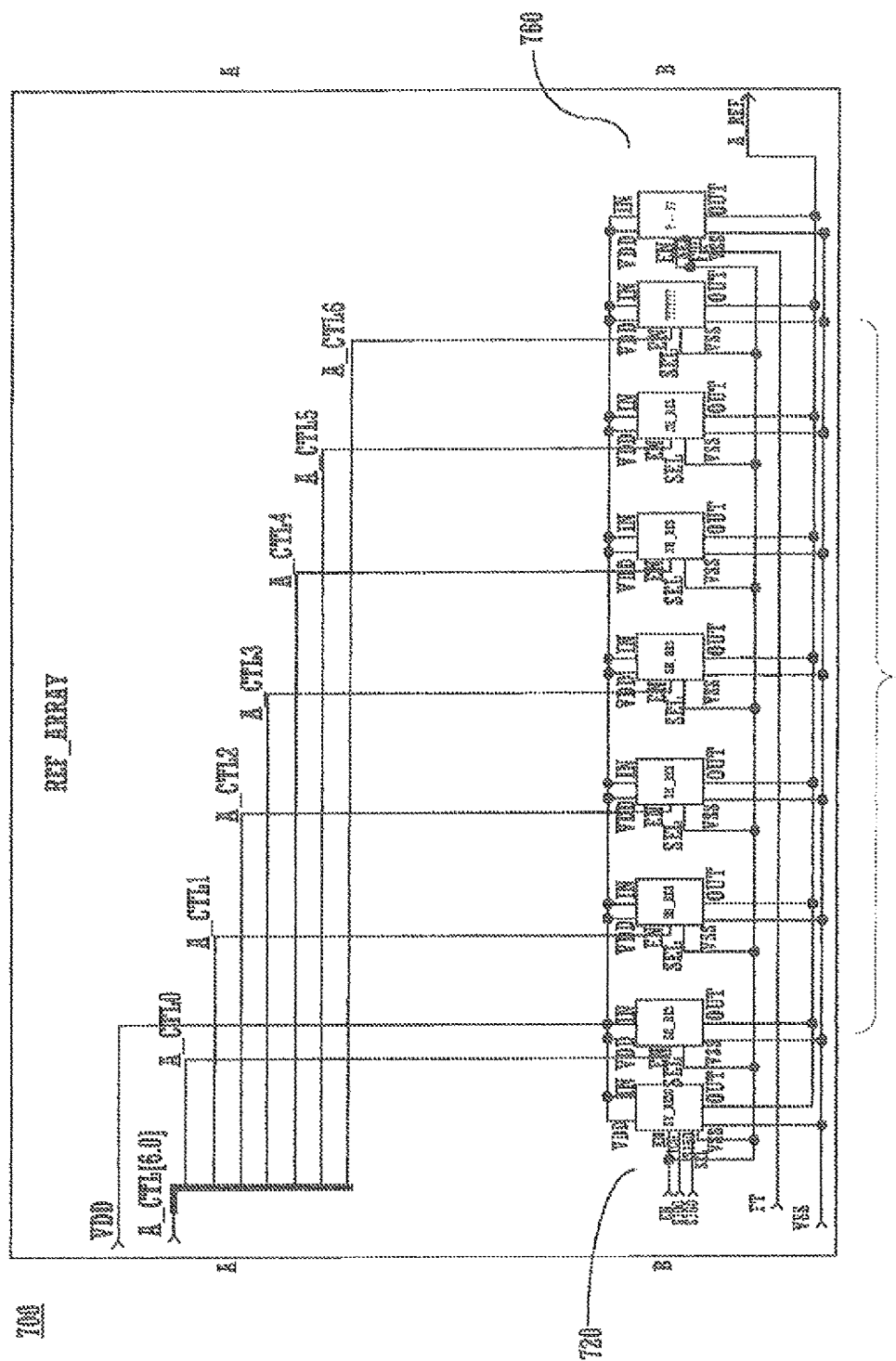
FIG. 7 is a circuit diagram of a reference array for configuring a digital portion of a configurable resistor network that is used in a self calibrating resistance circuit, in accordance with one embodiment of the disclosure.

For example, FIG. 7 is a circuit diagram of a reference array 700 for configuring a digital portion of a configurable resistor network, in accordance with one embodiment of the disclosure. As shown, reference array 700 has N selectable resistor banks 750 that are controlled by the resistor control block 260, 322, and/or 422. Resistor banks are added singly in parallel depending on the output of the resistor control block. After the resistor banks 750, an END control cell 760 guarantees that the circuit switches to FUNE TUNE mode in all cases. The last block on the right is the SW_RES_FT and is an analog adjust for fine tuning the resistance and allows for compensation if voltage or temperature changes.

Thereafter, analog fine tuning is performed in order to dynamically adjust the configurable resistance. In one implementation, the digital convergence circuitry, registers, and/or shift registers converges to the digital portion before the analog fine tuning is performed. In reference to FIG. 2, the self calibrating circuit 200 fine tunes the configurable resistance through dynamically tuning the analog portion. In one embodiment, for purposes of fine tuning, the analog portion is used in conjunction with the digital portion, and comprises a transistor (e.g., metal oxide semiconductor) that has a variable resistance depending on a gate to source voltage difference.

Figure 3B:
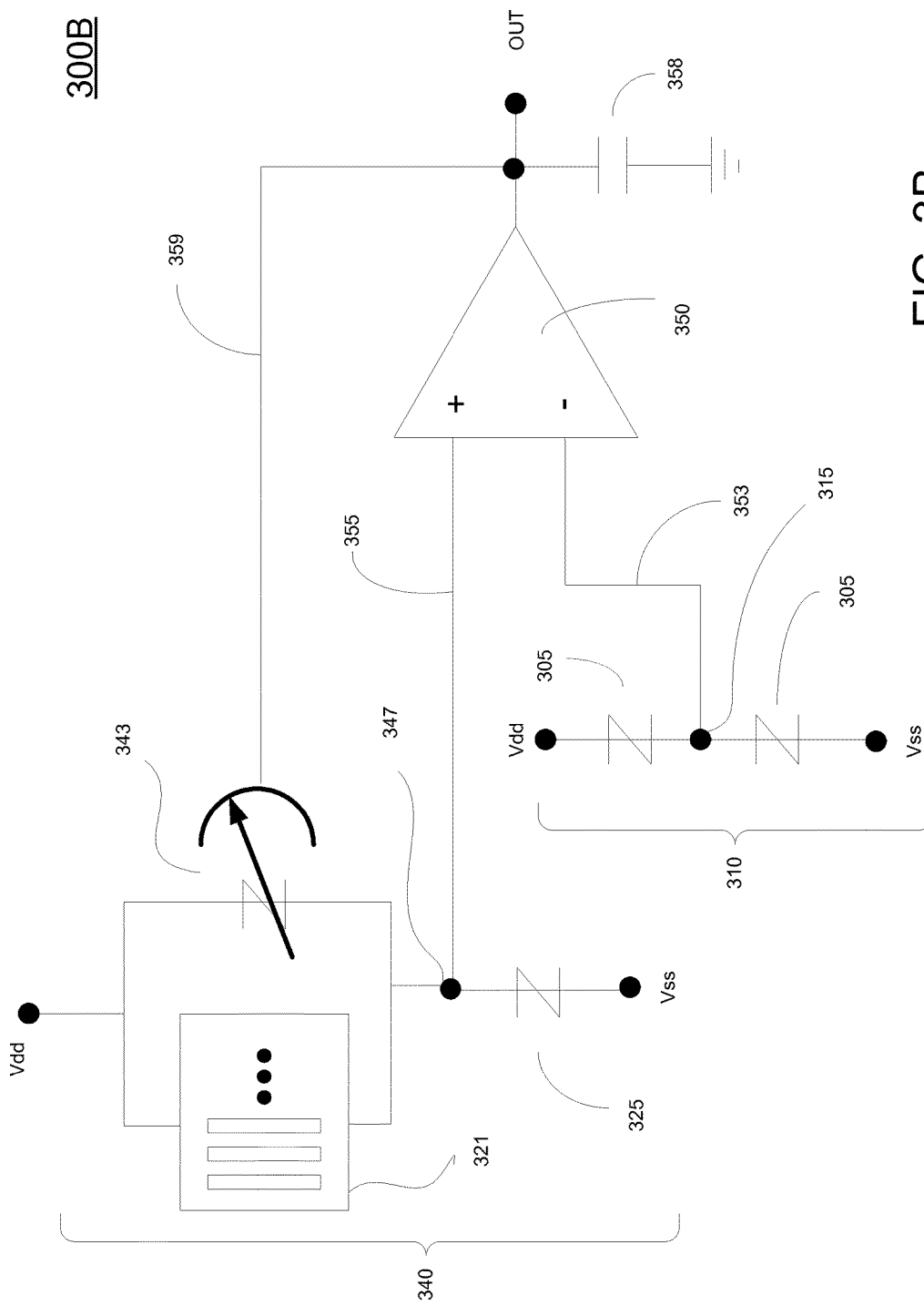
FIG. 3B is a circuit diagram of a comparator in a TERM_P resistance circuit used in a self calibrating resistance circuit for finely tuning an analog portion of the resistor network of FIG. 3A, wherein the analog portion is coupled in parallel with the digital portion, in accordance with one embodiment of the present disclosure.

FIG. 3B is a circuit diagram of a comparator circuit 300B, or TERM_P resistance circuit, for configuring an analog portion of the configurable resistor, in accordance with one embodiment of the invention. In particular, the comparator 350 in the TERM_P resistance circuit is used in a self calibrating resistance circuit for finely tuning an analog portion of a resistor network, wherein the analog portion is coupled in parallel with the digital portion as configured in FIG. 3A, in accordance with one embodiment of the present disclosure. Specifically, the output of the comparator circuit 300B is used to configure the analog portion of the configurable resistor through the TERM_P resistance circuit (e.g., 270) in order to configure a resistance that is referenced to a positive power supply (e.g., $V_{DD}$). This is accomplished by comparing divider voltages for a TERM_P resistance circuit. In one embodiment, comparator 350 is the same comparator 330 of FIG. 3A, wherein in other embodiments, comparator 350 is independent of comparator 330. Comparator circuit 300B is implementable within comparator 255 of FIG. 2, in one embodiment.

In particular, fixed voltage divider 310 includes resistors 305 with a node 315 that provides a fixed divider voltage. In one embodiment, resistors 305 are substantially identical, wherein in other embodiments, resistors in the fixed voltage divider 310 have different resistances. The fixed divider voltage provided at node 315 is also provided as an input 353 to comparator 350.

Another input 355 to comparator 350 is coupled to a second voltage divider 340 that comprises a second divider voltage measured at node 327. The second voltage divider 340 includes the reference resistor 325, and a configurable resistor. More particularly, the second voltage divider includes a node 347 that is used as an input 355 to the comparator 350. The configurable resistor includes the digital portion 321 that is configured through comparator circuit 300A, and an analog portion 343 that comprises a variable resistive branch coupled in parallel with the digital portion 321.

Comparator circuit 300B also includes an operational amplifier 350. Inputs to the operational amplifier includes a fixed divider voltage from the fixed voltage divider, and a second divider voltage from the second voltage divider. The operational amplifier 350 generates a bias voltage at an output. A capacitor 358 coupled to the output acts as a filter.

Specifically, as shown in FIG. 3B, the analog portion of the configurable resistance is dynamically tuned through the TERM_P resistance network 270. More particularly, the feedback loop 359 is enabled to fine tune the analog portion 343 of the configurable resistance, such that that the divider voltage provided by voltage divider 340 matches that provided by voltage divider 310. This is accomplished by feeding the bias voltage back to the second voltage divider for adjusting the analog portion of the configurable resistance. In particular, the bias voltage of the operational amplifier 350 is fed back to the variable resistive branch of the analog portion 343. As such, the analog fine tune is responsive to further fluctuations in temperature and voltage that affect the self calibrating resistance circuits 200A and 200B. For instance, in FIG. 6, the FTP signal provides an output of the comparator that is used to configure the analog portion 343 of the configurable resistance.

In one embodiment, the variable resistive branch of the analog portion comprises a transistor, wherein the transistor comprises a variable resistance as determined by a variable gate voltage. The gate voltage is controlled by a bias voltage provided by the comparator that is comparing divider voltages between the fixed voltage divider 310 and the second voltage divider 340. That is, the output of the comparator or operational amplifier is coupled to the transistor. In one embodiment, the transistor operates in the linear range when configuring the analog portion of the configurable resistance.

Figure 3C:
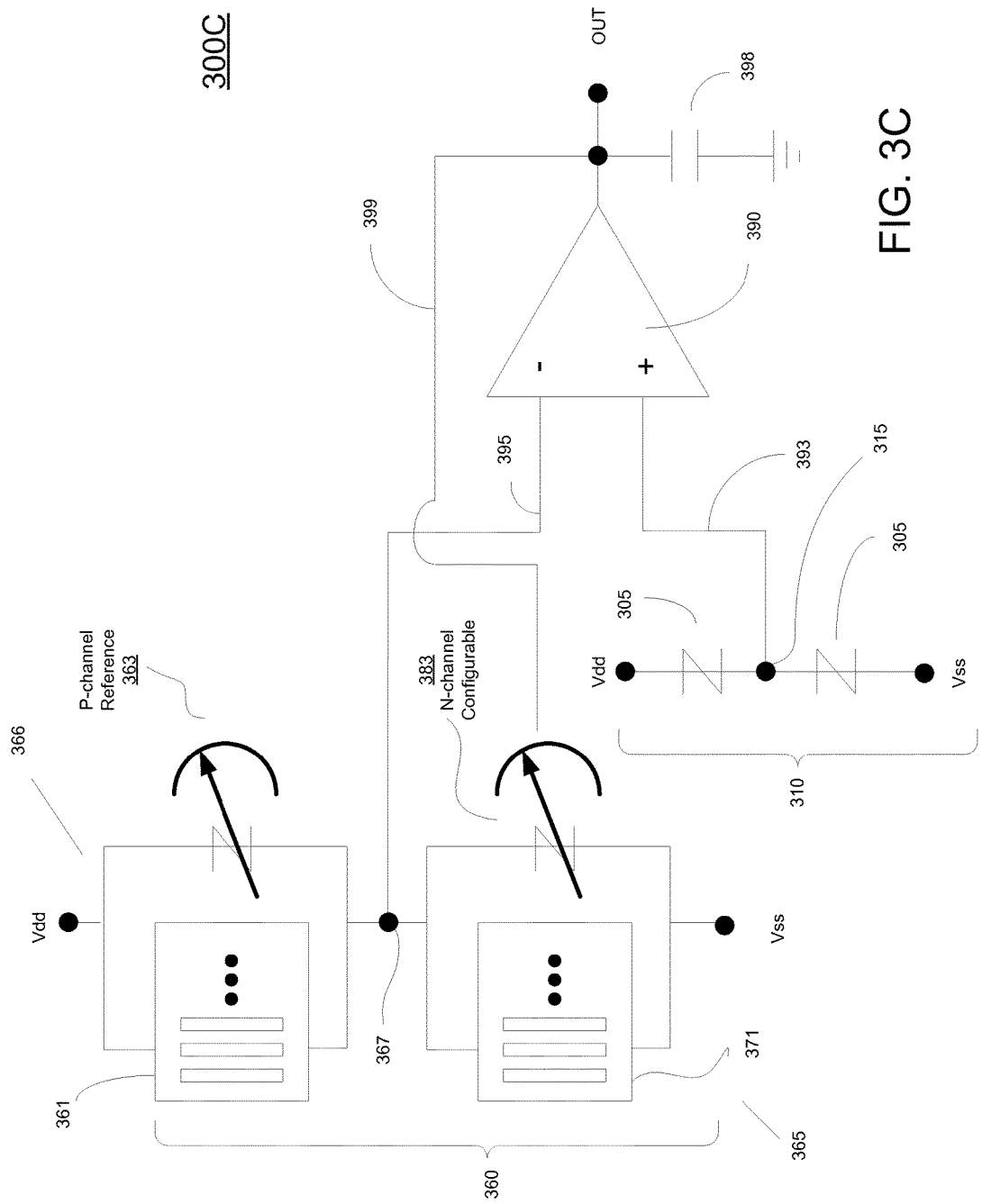
FIG. 3C is a circuit diagram of a comparator in an TERM_N resistance circuit used in a self calibrating resistance circuit for finely tuning an analog portion of the TERM_N resistance network, referenced to ground or Vss, in accordance with one embodiment of the present disclosure.

FIG. 3C is a circuit diagram of a comparator circuit 300C, or TERM_N resistance circuit, for configuring an analog portion of the configurable resistor, in accordance with one embodiment of the invention. In particular, the comparator 390 in the TERM_N resistance circuit is used in a self calibrating resistance circuit for finely tuning an analog portion of a resistor network, wherein the analog portion is coupled in parallel with the digital portion as configured in FIG. 3A, in accordance with one embodiment of the present disclosure. Specifically, the output of the comparator circuit 300B is used to configure the analog portion of the configurable resistor through the TERM_P resistance circuit (e.g., 270) in order to configure a resistance that is referenced to a negative power supply or ground (e.g., Vss). That is, the TERM_N resistance network 275 provides for an analog fine tuning of the configurable resistance for resistances referenced to or terminating to ground or Vss. This is accomplished by comparing divider voltages for a TERM_N resistance circuit. Comparator circuit 300C is implementable within comparator 255 of FIG. 2, in one embodiment.

In one embodiment, comparator circuit 300C is a complementary circuit that uses control signals generated from the comparator circuit 300B in order to configure a resistance that is referenced to ground or Vss. In particular, the comparator circuit 300C comprises a second resistor network 365 that provides a second configurable resistance that is referenced to ground or Vss. The second resistance network 365 is configured similarly to include a digital portion 371 and an analog portion 383. The digital portion 371 is configured similarly to the digital portions 321 of FIGS. 3A and 3B. Specifically, the outputs of the resistor control block 322 is used to configure the digital portion 371 of the second resistor network 365.

Once the digital portion 371 is configured and set, analog fine tuning is performed. That is, second control circuitry is used for configuring the second configurable resistance that is based on a second reference resistance, wherein the second reference resistance is obtained from control signals generated by the TERM_P resistance circuit 300B. That is, the second reference resistance is configured similarly as the resistor network used to configure the configurable resistance (e.g., comprising digital portion 321 and analog portion 343) of FIG. 3B. This is accomplished by fine turning the second analog resistor network 363.

Specifically, the TERM_N resistance network 275 is configured using the reference signals generated from the TERM-P resistance network 270 or 300B. That is, the configurable resistance generated through the TERM_P resistance network 270 or 300B, or its copy, acts as the reference resistance configuration 366 that is used to configure the TERM_N resistance network of 300C. For instance, in the comparator circuit 700, the FTP signal is used to build the n-channel configurable resistance 383 of the configurable second resistance configuration 365 comprising a digital portion 371 and the n-channel variable resistance 383.

Comparator circuit 300C also includes an operational amplifier 390. Inputs to the operational amplifier includes a fixed divider voltage from the fixed voltage divider 310, and a second divider voltage from the second voltage divider 360. The operational amplifier 390 generates a bias voltage at an output. A capacitor 398 coupled to the output acts as a filter.

In particular, fixed voltage divider 310 includes resistors 305 with a node 315 that provides a fixed divider voltage. In one embodiment, resistors 305 are substantially identical, wherein in other embodiments, resistors in the fixed voltage divider 310 have different resistances. The fixed divider voltage provided at node 315 is also provided as an input 393 to comparator or operational amplifier 390.

Another input 395 to operational amplifier 390 is coupled to a second voltage divider 360 that comprises a second divider voltage measured at node 367. The second voltage divider 360 includes the reference resistor configuration 366, and a configurable resistor configuration 365. More particularly, the second voltage divider includes a node 367 that is used as an input 395 to the comparator 390. The configurable resistor configuration 365 includes the digital portion 371 that is configured through comparator circuit 300A, and an analog portion 383 that comprises a variable resistive branch coupled in parallel with the digital portion 371. The digital portion 371 is configured similarly to the digital portions 321 of FIGS. 3A and 3B. Specifically, the outputs of the resistor control block 322 are used to configure the digital portion 371 of the second configurable resistor network.

Specifically, as shown in FIG. 3C, the analog portion of the configurable resistance is dynamically tuned through the TERM_N resistance network 275. More particularly, the feedback loop 399 is enabled to fine tune the analog portion 383 of the configurable resistance, such that that the divider voltage provided by voltage divider 360 matches that provided by voltage divider 310. This is accomplished by feeding the bias voltage back to the second voltage divider for adjusting the analog portion 383 of the configurable resistance 365. In particular, the bias voltage of the operational amplifier 390 is fed back to the variable resistive branch of the analog portion 383.

In one embodiment, the bias voltage is applied to the variable resistive branch of the analog portion 383 that comprises a transistor, wherein the transistor comprises a variable resistance as determined by a variable gate voltage. That is, the output of the comparator or operational amplifier is coupled to the transistor. In one embodiment, the transistor operates in the linear range when configuring the analog portion of the configurable resistance.

Since the analog fine tune is continuous and dynamic, the analog fine tune is responsive to further fluctuations in temperature and voltage that affect the self calibrating resistance circuits 200. For instance, in FIG. 6, the FTN2 signal provides an output of the comparator that is used to configure the analog portion 383 of the configurable resistance 365.

In another embodiment, rather than establish another comparator circuit for the TERM_N resistance network 275, voltages and current from the TERM_P resistance network 275, and/or the output generated by the TERM_P comparator circuit 300B of FIG. 3B, is mirrored to establish the analog portion of a configurable resistance. That is, a current mirror bias mirrors the bias from the analog FTP signal generated from the TERM_P resistance circuit 270 of FIG. 2 to form a mirrored FTN signal. For instance, as shown in the comparator circuit 600 of FIG. 6, a bias placed on FTP creates a current through transistor NPFTN 650. This current flows down through an enable switch NPOFF 653, and down through NNFTN 657 to create a self bias voltage. As such, the current flowing through the two transistors 650 and 657 match. Any change to FTP will be mirrored in a corresponding change in FTN (e.g., the voltages will track each other through the transistors 650 and 657).

Figure 4A:
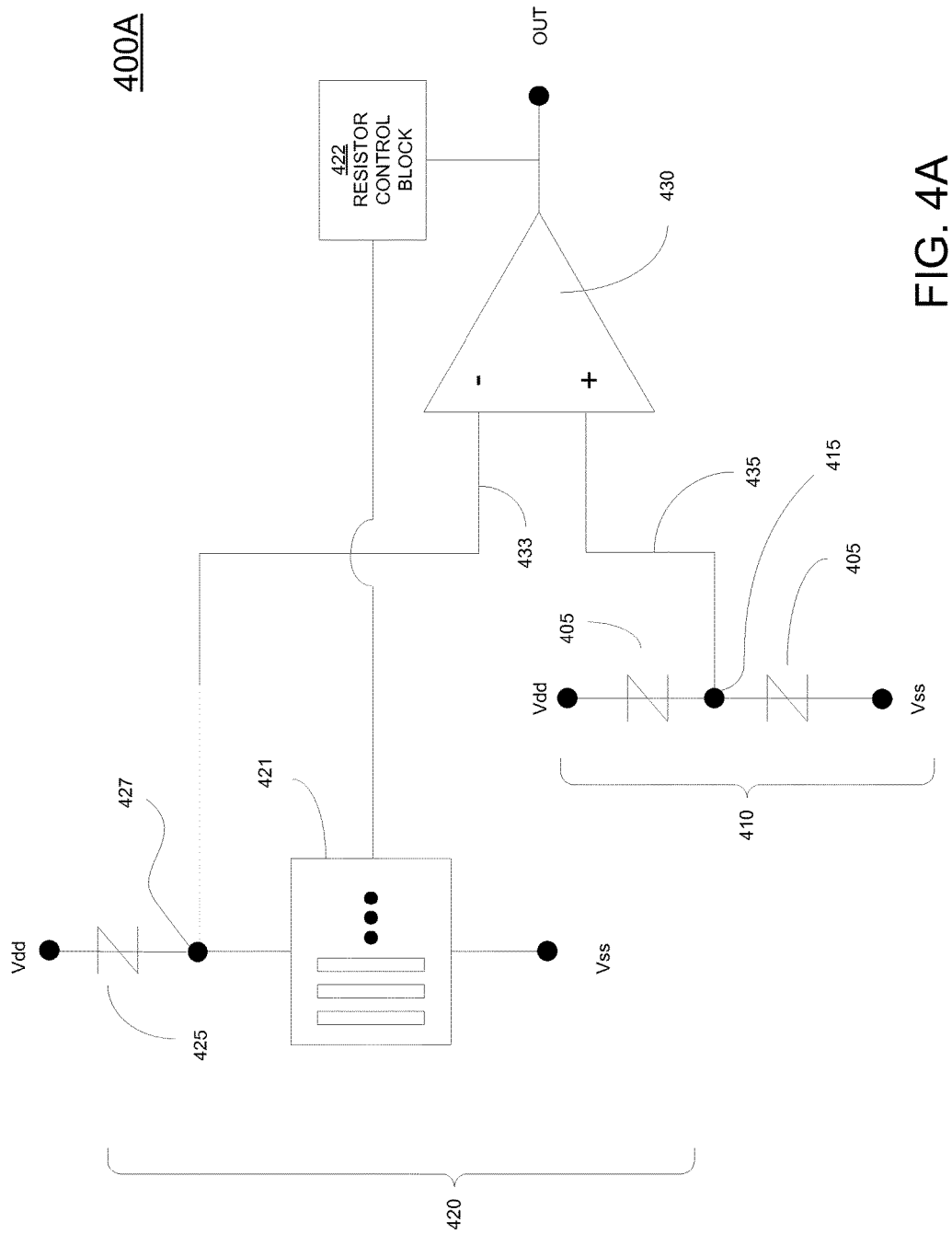
FIG. 4A is a circuit diagram of a comparator in a TERM_N resistance circuit, referenced to a power supply, and used in a self calibrating resistance circuit for coarsely and digitally converging a digital portion of a resistor network, in accordance with one embodiment of the disclosure

FIG. 4A is a circuit diagram of a comparator circuit 400A used for configuring a digital portion of a configurable resistor that is referenced to ground or Vss, in accordance with one embodiment of the invention. For instance, comparator circuit 400A is a stand-alone circuit that acts independently of the comparator circuits in FIGS. 3A-C. As an example, comparator circuit 400A may be used in conjunction with a pull down resistor (e.g., n-channel). As such, comparator circuit 400A is used in a self calibrating resistance circuit for coarsely and digitally converging a digital portion of a resistor network. In one implementation comparator circuit 300A is used within the comparator 255 of FIG. 2. In another implementation, comparator circuit 300A is used within comparator circuit 600 of FIG. 6.

Specifically, the output of the comparator circuit 400A is used to configure the digital portion of the configurable resistor 421. This is accomplished by comparing divider voltages between a fixed divider voltage and a second divider voltage. The comparator circuit 300A is implementable within the comparator 255 of FIG. 2, in one embodiment. In particular, a fixed voltage divider 410 comprises a fixed divider voltage measurable at node 415. The fixed voltage divider comprises a first resistive component and a second resistive component. In one implementation, the fixed voltage divider includes resistors 405 with a node 415 that is used as an input 435 to the comparator 430. In one embodiment, the resistors in the fixed voltage divider 310 comprises a one-to-one ratio, wherein the resistors 405 are substantially identical. In another embodiment, the resistors in the fixed voltage divider 310 comprises a fixed ratio that is not one-to-one, wherein the resistors are not identical.

Input 435 to the comparator 330 is coupled to a second voltage divider 420 that comprises a second divider voltage measured at node 427. The second voltage divider 320 includes a reference resistor 425, such as an external precision reference resistor. In addition, the second voltage divider 420 includes a configurable resistor that includes a digital portion 421 that is configured through comparator circuit 400A. The digital portion 421 comprises a plurality of selectable resistive branches arranged in a parallel configuration, wherein adding a resistive branch reduces the resistance of the digital portion 321, whereas removing a resistive branch increases the resistance of the digital portion 321.

The comparator 430 is configured to compare the second divider voltage and the fixed divider voltage to generate an output signal. The output signal is delivered to the resistor control block 422 in the digital mode to configure the digital portion 421 of the configurable resistance. In one embodiment, resistor control block 422 performs the same functions as resistor control block 260 of FIG. 2. In one embodiment, the resistor control block 422 includes digital convergence circuitry for adding or removing one of the plurality of parallel resistive branches used for configuring the digital portion 421 of the configurable resistor as determined by the output signal. In another embodiment, the resistor control block 422 includes a register for configuring the digital portion 421. In still another embodiment, the register comprises a shift register for configuring the digital portion 421 of the configurable resistor as determined by the output signal.

In particular, the digital convergence circuitry adds a resistive branch when and as long as the output signal indicates that the second divider voltage measured at node 427 is higher than the fixed divider voltage measured at node 415. Also, the digital convergence circuitry removes a digital resistive branch when the output signal indicates the second divider voltage measured at node 427 is lower than the reference divider voltage measured at node 415.

At a point when the output signal first indicates that the second divider voltage at node 427 is lower than the reference divider voltage measured at node 415, the resistor control block 422 removes a digital leg back from the digital portion and then locks the digital portion of the configurable resistor. At that time, the voltage measured at node 427 is again higher than the voltage at node 415, thereby indicating that the digital portion of the configurable resistance is again higher than the reference resistance. That is, the digital convergence circuitry digitally converges after a last resistive branch is added, which results in the output signal from the comparator 430 indicating that the second divider voltage at node 427 is lower than the fixed divider voltage at node 415, and when the last resistive branch is thereafter removed so that the configurable resistance is again greater than the reference resistance, which results in the output signal from the comparator 430 indicating that the voltage at node 427 is again higher than the voltage at node 415.

Thereafter, analog fine tuning is performed in order to dynamically adjust the configurable resistance. In one implementation, the digital convergence circuitry, registers, and/or shift registers converges to the digital portion before the analog fine tuning is performed. In one embodiment, for purposes of fine tuning, the analog portion is used in conjunction with the digital portion, and comprises a transistor (e.g., metal oxide semiconductor) that has a variable resistance depending on a gate to source voltage difference.

Figure 4B:
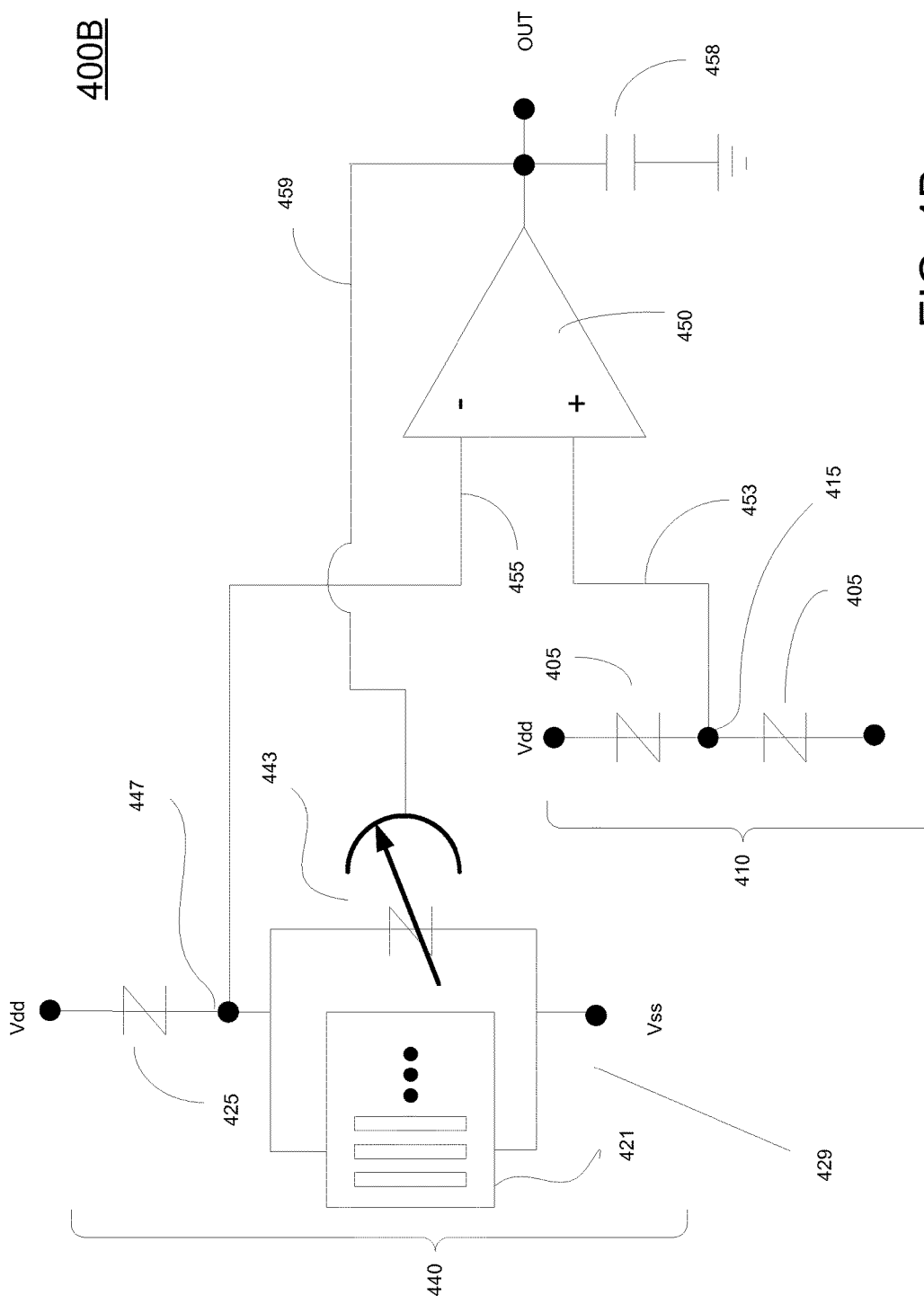
FIG. 4B is a circuit diagram of a comparator in a TERM_N resistance circuit used in a self calibrating resistance circuit for finely tuning an analog portion of the resistor network of FIG. 4A, wherein the analog portion is coupled in parallel with the digital portion, in accordance with one embodiment of the present disclosure.

More specifically, FIG. 4B is a circuit diagram of a comparator circuit 400B, or TERM_N resistance circuit, for configuring and fine tuning an analog portion of the configurable resistor introduced in FIG. 4A, wherein the analog portion 443 is coupled in parallel with the digital portion 421, in accordance with one embodiment of the present disclosure. Specifically, the output of the comparator circuit 400B is used to configure the analog portion of the configurable resistor through the TERM_N resistance circuit (e.g., 275) in order to configure a resistance that is referenced to a negative power supply or ground (e.g., Vss). This is accomplished by comparing divider voltages for a TERM_N resistance circuit. Comparator circuit 400B is implementable within comparator 255 of FIG. 2, in one embodiment.

Fixed voltage divider 410 includes resistors 405 with a node 415 that provides a fixed divider voltage. The fixed divider voltage provided at node 415 is also provided as an input 453 to comparator 450.

Another input 455 to comparator 350 is coupled to a second voltage divider 340 that comprises a second divider voltage measured at node 427. The second voltage divider 440 includes the reference resistor 425 coupled to $V_{DD}$, and a configurable resistor 429. More particularly, the second voltage divider includes a node 447 that is used as an input 455 to the comparator 450. The configurable resistor 429 includes the digital portion 421 that is configured through comparator circuit 400A, and an analog portion 443 that comprises a variable resistive branch coupled in parallel with the digital portion 421.

As such, inputs to the operational amplifier 450 includes a fixed divider voltage from the fixed voltage divider 410, and a second divider voltage from the second voltage divider 440. The operational amplifier 450 generates a bias voltage at an output. A capacitor 458 coupled to the output acts as a filter.

Specifically, as shown in FIG. 4B, the analog portion of the configurable resistance is dynamically tuned through the TERM_N resistance network 275, and as shown in FIG. 4B. More particularly, the feedback loop 459 is enabled to fine tune the analog portion 443 of the configurable resistance, such that that the divider voltage provided by voltage divider 440 matches that provided by voltage divider 410. In particular, the bias voltage of the operational amplifier 450 is fed back to the variable resistive branch of the analog portion 443.

In one embodiment, within the digital course adjust there is a range select function that selects the proper starting point range desired with respect to the external R_REF value. The initial starting range select R value is always larger than R_REF. For instance, returning to the reference array 700 shown in FIG. 7, the schematic block SW_REF0 720 contains a range select circuit that is controlled by signals R1(S100) and R0(S150). These are used for range selection and are user selectable.

As examples of range selection, Table 800 in FIG. 8 illustrates a range select feature of the self calibrating resistance circuit, in accordance with one embodiment of the invention. The ranges provided in Table 800 are provided for illustration purposes only, as embodiments are well suited to supporting various ranges for setting an initial value of the range select. In particular, a range selector is configurable to select a range for setting an initial resistance of the digital portion of the configurable resistance, wherein the reference resistance and/or the initial resistance selected falls within the range that is selected. For instance, Table 800 shows three ranges for selection. In the maximum range, the reference resistance value falls within the range of 180-240 ohms. As such, the initial value of the digital portion of the configurable resistance starts at the top value of the maximum range, or 240 ohms. In the middle or nominal range, the reference resistance value falls within the range of 135-180 ohms. As such, the initial value of the digital portion of the configurable resistance starts at the top value of the nominal range, or 180 ohms. In the minimum range, the reference resistance value falls within the range of 100-135 ohms. As such, the initial value of the digital portion of the configurable resistance starts at the top value of the minimum range, or 135 ohms.

Figure 5A:
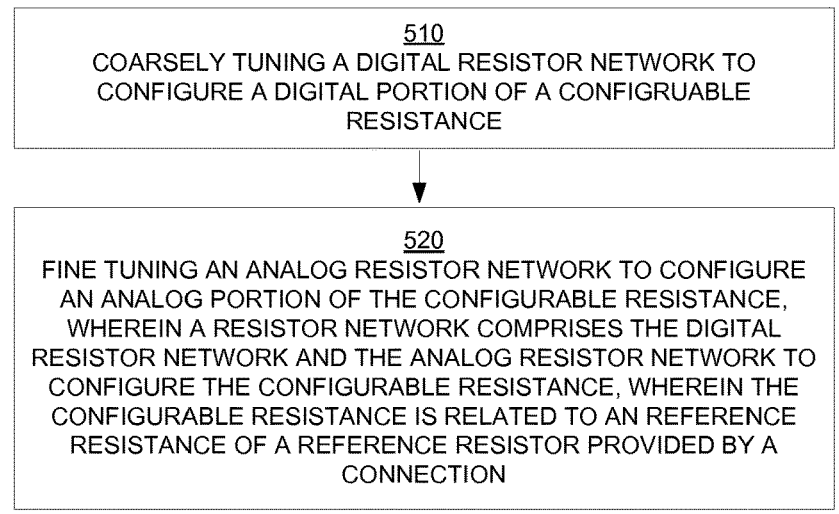
FIG. 5A is a flow diagram illustrating a method for self calibrating a resistor network comprising a digital portion and an analog portion to a reference resistor, in accordance with one embodiment of the disclosure.
Figure 5B:
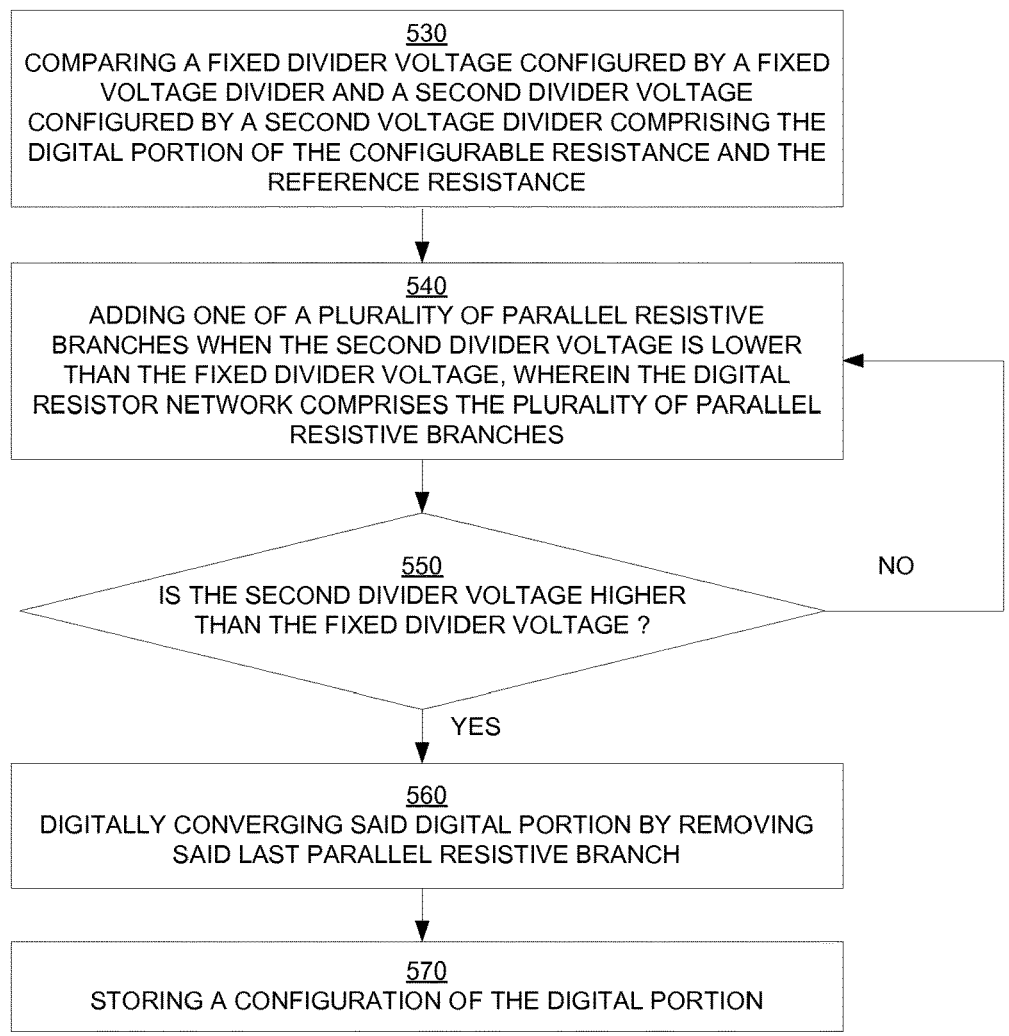
FIG. 5B is a flow diagram illustrating a method for digitally converging a digital portion of the resistor network of FIG. 5A, in accordance with one embodiment of the present disclosure.

FIGS. 5A-B are flow diagrams 500A and 500B, illustrating methods for self calibrating to a reference resistor, in accordance with one embodiment of the disclosure. Diagrams 500A-B are implementable within the self calibrating resistance circuit 200 of FIG. 2, in embodiments of the present disclosure. In another implementation, flow diagrams 500A and 500B are configured to self calibrate a configurable resistor located on a die of an integrated circuit to an external reference resistance, such as, that provided over a connection to the integrated circuit. The configurable resistor comprises a resistor network that is coupled to a connection, wherein the connection provides a signal from a reference resistor. The resistor network comprises a digital portion and an analog portion of the configurable resistor.

FIG. 5A is a flow diagram 500A illustrating a method for converging a digital portion and an analog portion of a resistor network, in accordance with one embodiment of the present disclosure. At 510 of FIG. 5A, the digital resistor network is coarsely tuned. More particularly, the coarse tuning configures a digital portion of a configurable resistance that is used for self calibrating to a reference resistance. As previously described in relation to FIGS. 3A and 4A, coarse tuning involves the digital portion of the resistor network, without consideration of the analog portion of the resistor network.

More particularly, FIG. 5B is a flow diagram 500B illustrating a method for digitally converging a digital portion of the resistor network introduced in FIG. 5A, in accordance with one embodiment of the present disclosure. Specifically, a comparator is used for comparing a fixed divider voltage with a second divider voltage to generate an output signal at 530 of FIG. 5B. The fixed voltage divider comprises two resistors coupled in series with a connection to $V_{DD}$, and a middle node that provides $V_{DD}/2$. The second voltage divider comprises the digital portion of the resistor network coupled in series with the reference resistor and to $V_{DD}$.

The output of the comparator is delivered to a resistor control block in the digital mode, such that a resistive digital branch is added when the output signal indicates that the second divider voltage ratio is lower than the fixed divider voltage at 540 (of FIG. 5B). In addition, an initial value of the digital portion of the configurable resistance is greater than the reference resistance, and is lowered during coarse tuning.

At decision step 550 of FIG. 5B, the divider voltages are compared to determine if the second divider voltage is higher than the fixed divider voltage. If not, then another parallel resistive branch is added at 540. However, if the second divider voltage is higher than the fixed divider voltage, then at 560 of FIG. 5B the last resistive digital branch is removed when the output signal indicates that the second divider voltage is higher than the fixed divider voltage. This condition exists when too many resistive branches have been added in parallel, and as such, a resistive digital branch is then removed. This provides a digital portion of the configurable resistance that is still greater than the reference resistance. Once the digital resistor network has digitally converged and is coarsely tuned, the configuration of digital resistive branches is locked for purposes of fine tuning the configurable resistance. That is, the digital portion that is in parallel with the analog portion is fully configured.

In one embodiment, the digital portion of the configurable resistance is stored at 570 of FIG. 5B. For example, the configuration of the digital resistive branches for the digital portion is stored in registers. In one implementation, a "1" associated with a resistive branch indicates that that branch is included in the digital portion, whereas a "0" indicates that the branch is not included. Of course, the reverse implementation may also be used to indicate whether a branch is included or not in the digital portion. As such, since the digital portion is stored, readily accessed, and easily reconfigurable, only the fine tuning of the resistor network is performed when exiting a low power state that configures both the analog and digital portions of the configurable resistance as open circuits. That is, the digital portion is reconfigured using the stored values, and fine tuning is performed to tune the analog portion of the configurable resistance, as is described below.

In particular, the configurable resistance can be further tuned by fine tuning the analog portion of the resistor network that is coupled in parallel with the digital portion. Returning to FIG. 5A, at 520, the analog resistor network and correspondingly the analog portion of the configurable resistance is fine tuned. As such, the total configurable resistance is also fine tuned, since the resistor network calibrating the configurable resistance comprises the previously locked digital resistor network coupled in parallel with the analog resistor network. The configurable resistance is related to the reference resistance of a reference resistor provided by the connection. In one embodiment, the configurable resistance is substantially identical to the reference resistance.

Fine tuning involves both the digital portion and the analog portion of the resistor network. However, the digital portion has been locked to a value, as provided by the coarse tuning performed in 510. The fixed divider voltage is compared with a second divider voltage to generate an output signal. Again, the fixed voltage divider comprises two resistors coupled in series with a connection to $V_{DD}$, and a middle node that provides $V_{DD}/2$. The second voltage divider now comprises the resistive network coupled in series with the reference resistor and to $V_{DD}$. The resistive network comprises the digital portion and the analog portion, wherein the analog portion is fine tuned to allow the configurable resistance to match the reference resistance.

Fine tuning the analog portion of the configurable resistance is aided by the feedback loop coupling the output of the comparator to the second voltage divider providing an input to the comparator. In particular, a bias voltage is generated through an operational amplifier that is configured with inputs coupled to said fixed voltage divider and said second voltage divider. The bias voltage is then fed back to the second voltage divider for adjusting the analog portion of the configurable resistance. In one embodiment, the analog portion of the configurable resistance comprises an adjustable resistive branch that is coupled in parallel with the digital portion that is adjustable through a transistor configuration. For instance, the adjustable resistive branch comprises a transistor with a variable resistance that is controlled by varying the gate to source voltage over the transistor. As such, the feedback loop continually varies the gate voltage on the transistor in order to provide the proper proportions between the reference resistor and the configurable resistor. In one embodiment, the gate voltage is varied on the transistor in order to match the configurable resistor to the reference resistor, wherein the configurable resistance is substantially the same as the reference resistance.

Moreover, the analog portion is fine tuned in a dynamic fashion. As such, the analog portion is continuously updated in response to fluctuations in voltage and temperature affecting the self calibrating resistance circuit performing the method outlined in FIG. 5A. As such, the configurable resistance is dynamically adjusted by dynamically adjusting the analog portion of the resistor network.

In another embodiment, the digital portion and the analog portion are configured as open circuits when in a low power state. The configuration of the digital portion has been stored before entering the low power state. As such, when exiting the low power state, the stored configuration of the digital portion is retrieved to re-enable the digital portion of the configurable resistance. Thereafter, only fine tuning need be performed to configure the configurable resistance when exiting the low power state.

Figure 6:
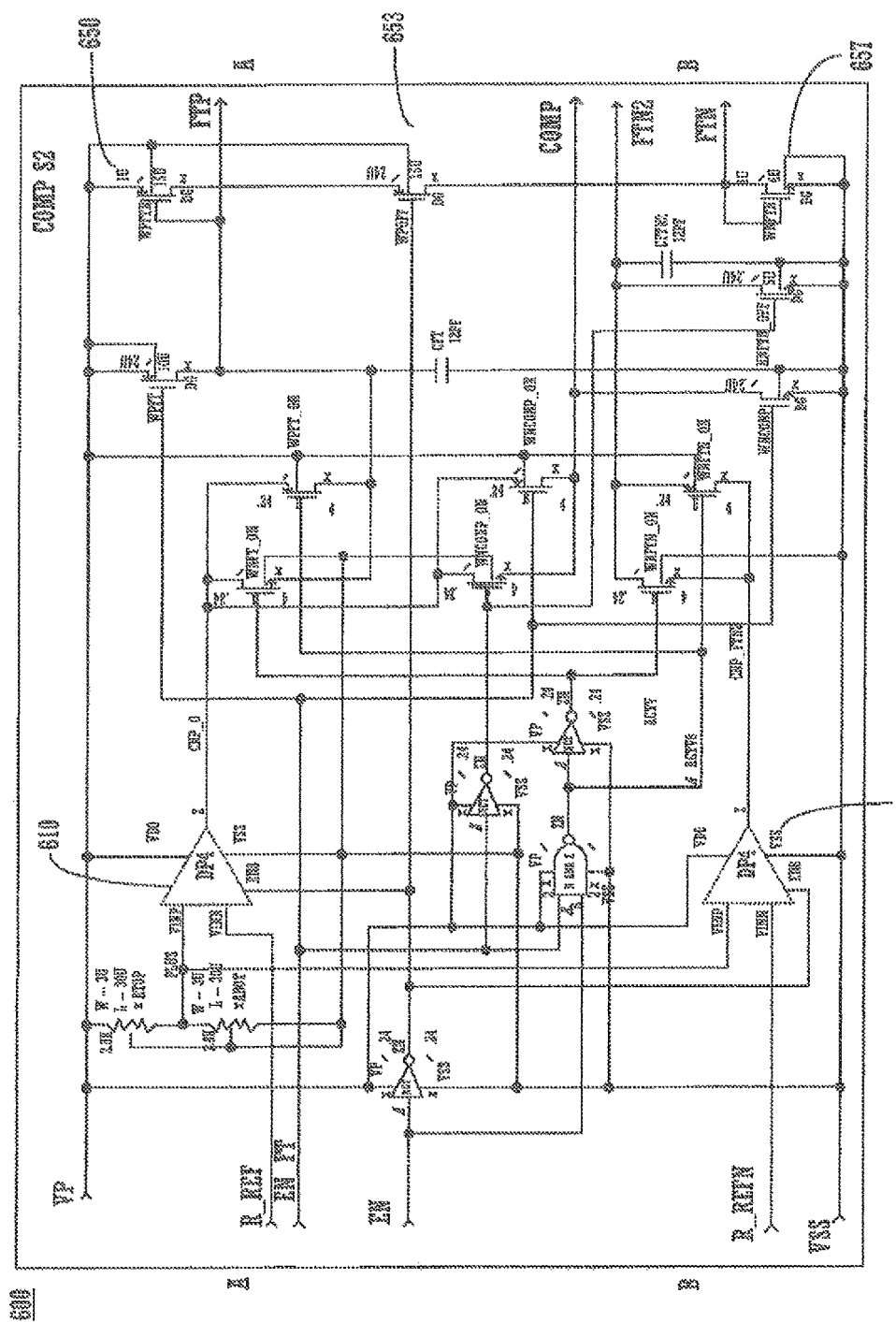
FIG. 6 is a circuit diagram of a comparator circuit used in a self calibrating resistance circuit, in accordance with one embodiment of the disclosure.

FIG. 6 is a circuit diagram of a comparator circuit 500 used in a self calibrating resistance circuit, in accordance with one embodiment of the disclosure. Comparator circuit 600 implements the functions of comparator 255 of FIG. 2, as well as comparators found in of FIGS. 3A-C and 4A-B to coarsely tune a digital portion of a configurable resistor and to finely tune an analog portion of the configurable resistor.

As shown, comparator circuit 600 compares a reference voltage that is generated by a resistor divider network to the voltage between the reference array establishing the configurable resistor and the reference resistor. Circuit 600 operates in a coarse mode used for tuning the digital portion of the configurable resistor, and an analog fine tune mode used for fine tuning the analog portion of the configurable resistor.

In the coarse mode, the operational amplifier 610 generates a value of one or zero for the COMP signal depending on the voltage comparison, as previously described. Selection of one or more parallel, digital resistive branches is selected during the coarse mode. Once the digital portion of the configurable resistance is determined in coarse mode, the digital portion is fully configured and locked for purposes of fine tuning the configurable resistance.

During the analog fine tune mode, the operational amplifier 610 may be used to generate analog voltages FTP and FTN, or FTP and FTN2. For instance, operational amplifier 610 is used to generate FTP in a TERM_P resistive circuit (e.g., circuit 270. In particular, as shown in FIG. 6, the TERM_P resistance network including operational amplifier 610 and p-channel 650 is used for terminating a line to a power supply, such as $V_{DD}$. The TERM_P resistance provides for an analog fine tuning of the configurable resistance for lines referenced to $V_{DD}$. The resulting resistance provided by the corresponding p-channel provides for an analog portion of the configurable resistance that is dynamically tuned, and configured in parallel with the digital portion of the configurable resistance.

Figure 9A:
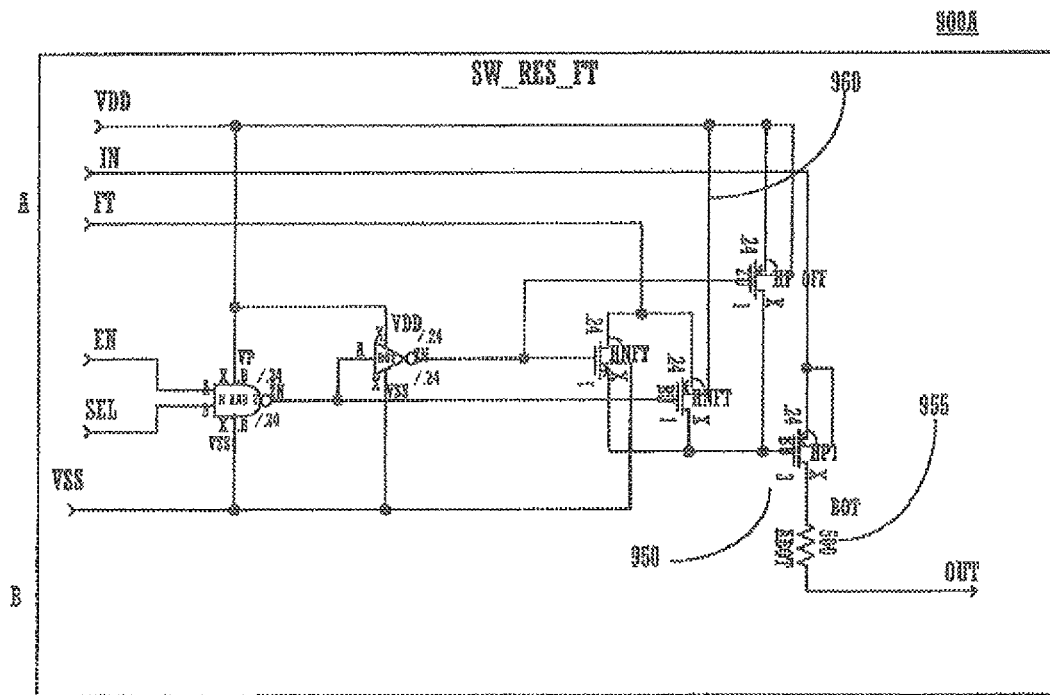
FIG. 9A is a circuit diagram of a TERM_P resistance network for terminating a line to a positive power supply, such as $V_{DD}$, in accordance with one embodiment of the disclosure.

FIG. 9A is a more detailed illustration of a TERM_P resistance circuit 900A. In particular, p-channel transistor 950 provides for the analog portion of the configurable resistance that is dynamically tuned. P-channel 950 is configured in parallel with the digital portion of the configurable resistance. P-channel 950 is controlled by the FT or FTP signal as delivered through intervening pass gates. Resistor 955 coupled to p-channel 950 helps ensure that the p-channel 950 operates in the linear region, in one embodiment. In addition, the output of TERM_P resistance circuit 900A is coupled to a pad (not shown), and the IN line is coupled to a positive voltage, such as, $V_{DD}$. A feedback 960 is provided that is used to adjust the gate voltage of the p-channel 950 in order to tune the configurable resistance proportionally to the reference resistor.

Figure 9B:
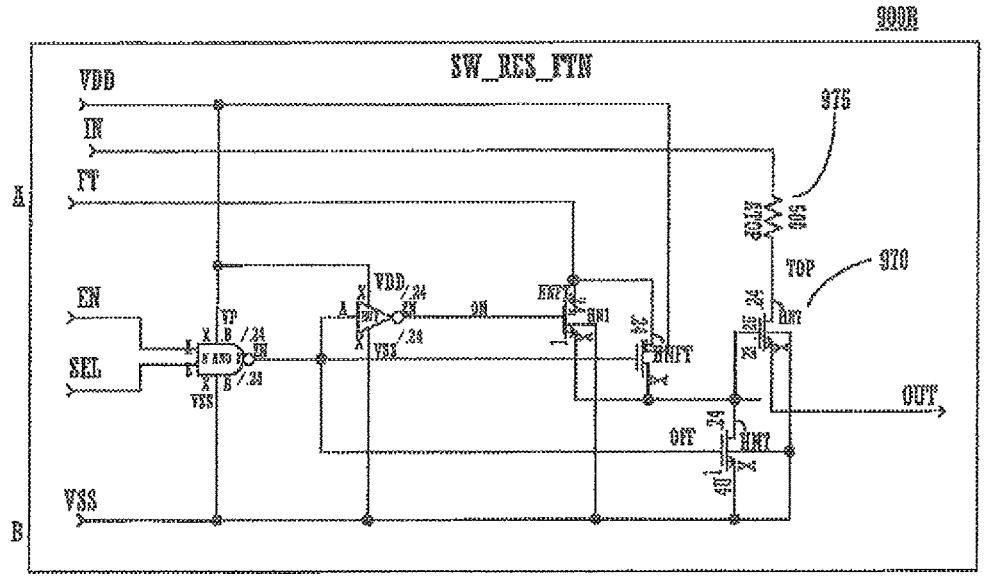
FIG. 9B is a circuit diagram of an TERM_N resistance network for terminating a line to ground or Vss, in accordance with one embodiment of the disclosure.

FIG. 9B is a circuit diagram of an TERM_N resistance network for terminating a line to ground or Vss, in accordance with one embodiment of the disclosure. FIG. 9B is a more detailed illustration of a TERM-N resistance circuit 900B. In particular, n-channel transistor 970 provides for the analog portion of the configurable resistance that is dynamically tuned. N-channel 970 is configured in parallel with the digital portion of the configurable resistance. N-channel 970 is controlled by the FT or FTN signal as delivered through intervening pass gates. Resistor 975 coupled to n-channel 970 helps ensure that the p-channel 970 operates in the linear region, in one embodiment. In particular, the output is coupled to Vss or ground. In addition, the input IN is connected to the pad (not shown), through which there is coupling between the TERM_P resistance circuit 900A and TERM_N resistance circuit 900B. A feedback is provided that is used to adjust the gate voltage of the n-channel 970 in order to tune the configurable resistance proportionally to the reference resistor.

Figure 10:
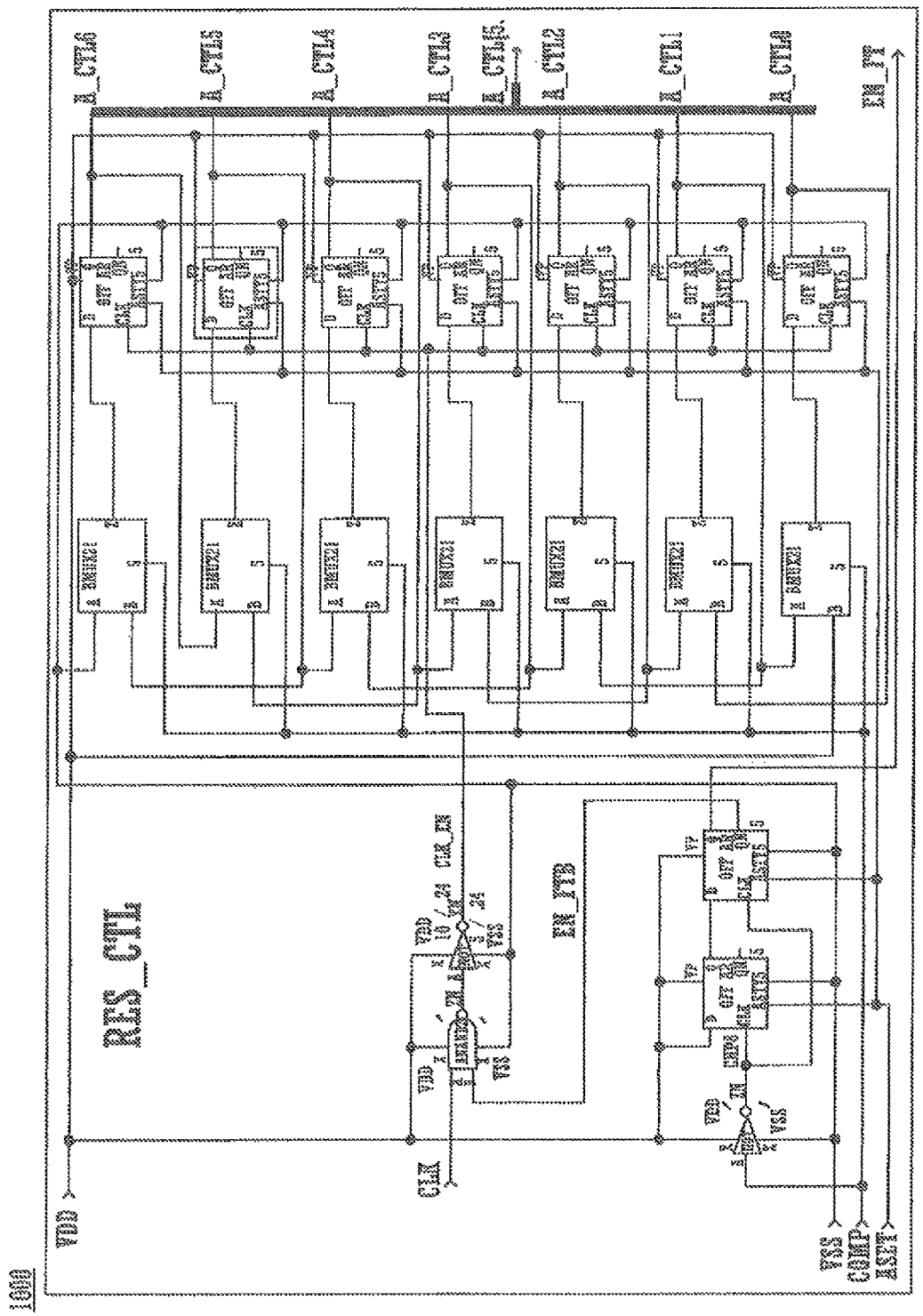
FIG. 10 is a circuit diagram of a resistor control block used for configuring the digital and analog portions of the configurable resistor in a self calibrating resistance circuit, in accordance with one embodiment of the disclosure.

FIG. 10 is a circuit diagram of a resistor control block 1000 used for configuring the digital portions of the configurable resistor in a self calibrating resistance circuit, in accordance with one embodiment of the disclosure. For instance, resistor control block 1000 performs the same functions as control blocks 322 and 422 of FIGS. 3B and 4B, respectively, and are used to digitally converge the digital portions of respective configurable resistances.

Figure 11:
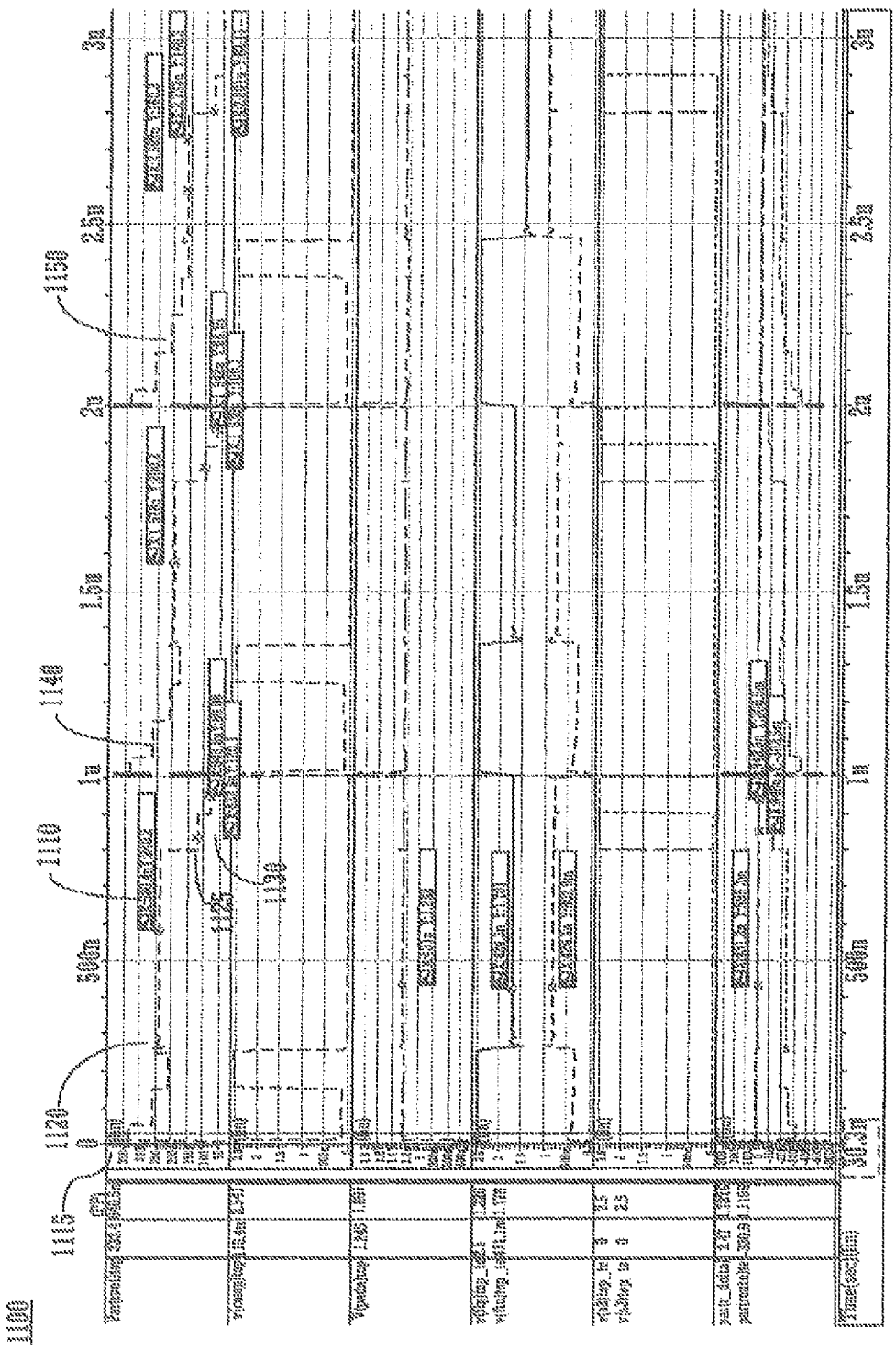
FIG. 11 is a signal diagram illustrating waveforms of simulation results when implementing a self calibrating resistance network, in accordance with one embodiment of the present disclosure.

FIG. 11 is a signal diagram illustrating waveforms of simulation results when implementing a self calibrating resistance network, in accordance with one embodiment of the present disclosure. For instance, signal waveform 1110 shows the digital and analog convergence of a configurable resistance. As shown, the reference resistance is approximately 240 ohms. The initial resistance of the configurable resistance is greater than 240 at point 1115 and digitally converges within 2 or 3 clocks. At point 1120, the transition between the digital mode and the analog mode is shown. For example, the digital resistance has gone too low and is increased by removing a parallel resistive branch in the digital portion. Also, the quick convergence of the analog fine tuning is shown, such that the configurable resistance is at approximately 240 ohms. In addition, at 1125, there is a step down of resistance values by one-half to 120 ohms, such that other resistances can be provided throughout the I/O circuit. Also, at 1130, there is a further step down of resistance values to one-third the original resistance value, to 80 ohms, of the configurable resistance. Other waveforms 1140 and 1150 illustrate the calibration to reference resistances of approximately 200 and 160 ohms, respectively.

Figure 12:
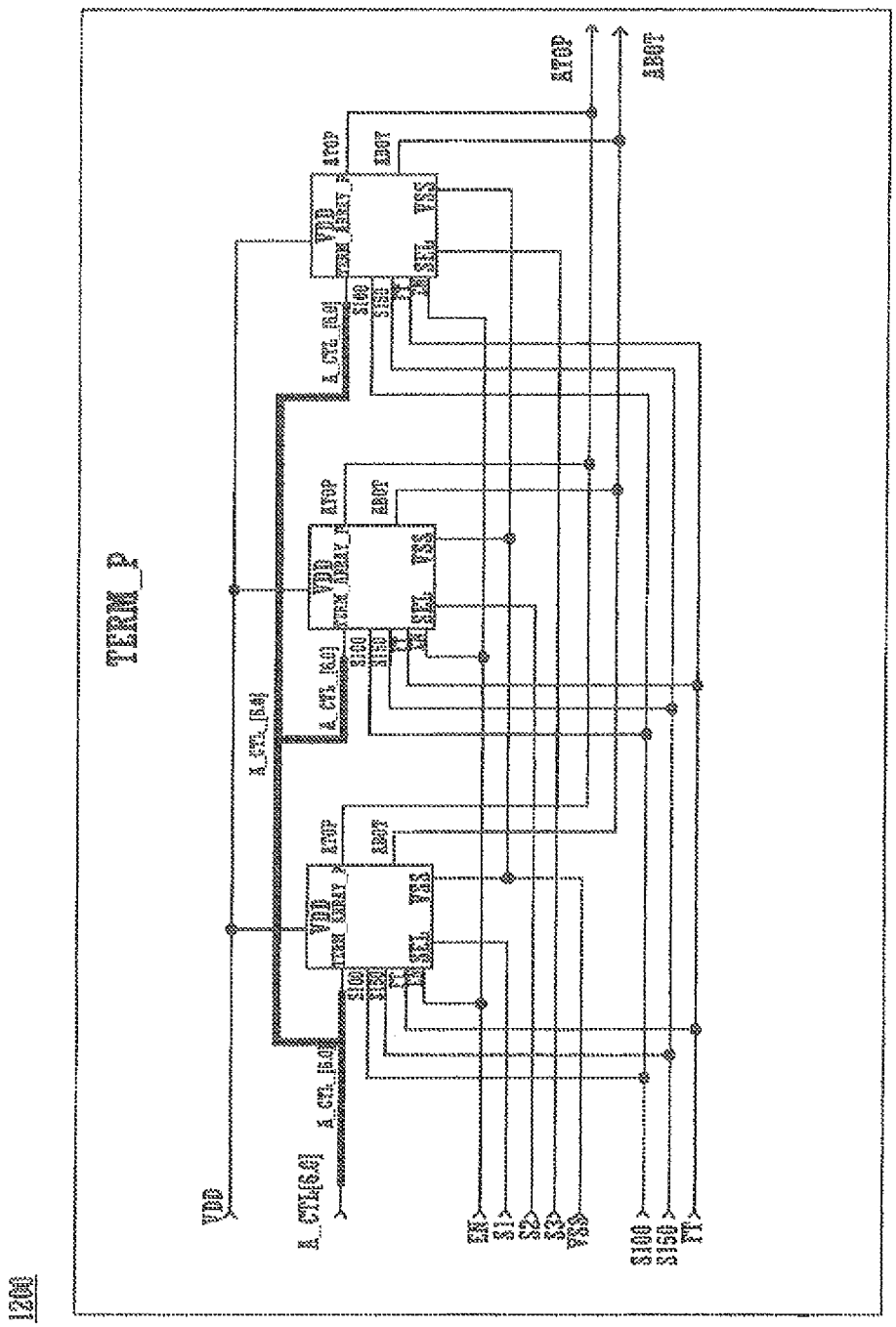
FIG. 12 is a circuit diagram illustrating a resistance step down feature of the self calibrating resistance circuit, in accordance with one embodiment of the disclosure.

FIG. 12 is a circuit diagram illustrating a step down feature of the self calibrating resistance circuit, in accordance with one embodiment of the disclosure. As shown, three configurable resistance circuits are shown coupled in parallel. Selection of one or more of the configurable resistance circuits 1250 will determine the overall resistance value. For instance, using only one configurable resistance circuit 1250 provides for a full resistance value (e.g., 240 ohms). However, coupling two configurable resistance circuits 1250 together results in a step down of one-half of the total resistance value (e.g., 120 ohms). Also, coupling three configurable resistance circuits 1250 together results in a step down of one-third of the total resistance value (e.g., 80 ohms).

Thus, according to embodiments of the present disclosure, circuits and methods for self calibrating to a reference resistance are described. Embodiments of the present invention provide for circuits and methods that self calibrate to a reference resistance provided by a connection to a configurable resistor network that comprises a digital portion for coarse tuning the configurable resistor network and an analog portion for dynamic fine tuning of the configurable resistor network.

While the foregoing disclosure sets forth various embodiments using specific block diagrams, flow charts, and examples, each block diagram component, flow chart step, operation, and/or component described and/or illustrated herein may be implemented, individually and/or collectively. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

The invention claimed is:

1. An apparatus for self-calibrating a configurable resistance on an integrated circuit, comprising:
    a first power supply node;
    a second power supply node;
    a reference connection node;
    a reference voltage source;
    a voltage divider comprising:
        the configurable resistance coupled between the first power supply node and the reference connection node,
            wherein the configurable resistance comprises a digital resistor network coupled in parallel with an analog resistor network, and
        a reference resistor coupled between the reference connection node and the second power supply node;
    control circuitry coupled to the reference connection node and the reference voltage source for configuring the configurable resistance based on the resistance of the reference resistor by tuning the digital resistor network and by dynamically tuning the analog resistor network;
    a register coupled to the control circuitry and to a plurality of digital control signals for storing the current data word and applying the combined state to the digital control signals;
    a first amplifier comprising:
        an output coupled to the control circuitry,
        a first input coupled to the reference voltage source, and
        a second input coupled to the reference connection node;
    wherein the digital resistor network comprises a plurality of selectable resistive branches in parallel, each branch being coupled to one of the digital control signals and selected according to the state of that digital control signal;
    wherein the resistance of the digital resistor network is determined by applying a data word comprising the desired combined state of the digital control signals to the digital control signals;
    wherein the amplifier is used to compare the voltage on the reference connection node to the reference voltage and indicating the result to the control circuitry such that:
        if the voltage on the reference connection node is higher than reference voltage the output of the amplifier is in a first logic state,
        else the amplifier output is in a second logic state; and
    wherein tuning the digital resistor network comprises:
        (i) loading the data word corresponding to the highest tuned resistance into the register, applying the combined state to the digital resistor network, and observing the logic state of the output of the amplifier,
        (ii) decreasing the resistance of the digital resistor network in a series of steps by loading a new data word into the resistor and applying the combined state to the digital control signals, wherein for each step:
            a new data word is loaded into the register selecting an additional selectable resistive branch in parallel to the previously selected branch, and
            the logic state of the output of the amplifier is observed until the logic state of the output of the amplifier changes,
        (iii) selecting the last data word loaded prior to the logic state of the output of the amplifier changing, and
        (iv) loading the selected data word into the register and applying the combined state to the digital control signals.

2. The apparatus of claim 1:
    wherein the analog resistor network comprises a variable resistive branch coupled to an analog control signal;
    wherein the resistance of the analog resistor network is determined by the value of the analog signal;
    wherein the output of the first amplifier is additionally coupled to the analog signal; and
    wherein dynamically tuning the analog resistor network comprises:
        (i) dynamically comparing the voltage on the reference connection node to the reference voltage, and
        (ii) dynamically controlling the value of the analog signal using a feedback loop to tune the resistance of the analog resistor network such that the reference voltage and the voltage at the reference connection node are substantially equal.

3. The apparatus of claim 2:
    wherein the first power supply node is coupled to a positive voltage;
    wherein the second power supply voltage is coupled to ground;
    wherein the reference voltage source is a resistor divider; and
    wherein the reference resistor is external to the integrated circuit.

4. The apparatus of claim 1 further comprising:
    a second amplifier comprising:
        an output coupled to an analog control signal, a first input coupled to the reference voltage source, and a second input coupled to the reference connection node;

wherein the analog resistor network comprises a variable resistive branch coupled to an analog control signal;

wherein the resistance of the analog resistor network is determined by the value of the analog signal; and wherein dynamically tuning the analog resistor network comprises:
  (i) dynamically comparing the voltage on the reference connection node to the reference voltage, and
  (ii) dynamically controlling the value of the analog signal using a feedback loop to tune the resistance of the analog resistor network such that the reference voltage and the voltage at the reference connection node are substantially equal.

5. The apparatus of claim 4:
wherein the first power supply node is coupled to a positive voltage;
wherein the second power supply voltage is coupled to ground;
wherein the reference voltage source is a resistor divider;
wherein the reference resistor is external to the integrated circuit;
wherein the first amplifier is a comparator; and
wherein the second amplifier is an operational amplifier.

* * * * *